United States Patent [19]

Howell

[11] Patent Number: 4,978,955
[45] Date of Patent: Dec. 18, 1990

[54] DATA RANDOMIZING/DE-RANDOMIZING CIRCUIT FOR RANDOMIZING AND DE-RANDOMIZING DATA

[75] Inventor: Jones V. Howell, Newport Beach, Calif.

[73] Assignee: Archive Corporation, Costa Mesa, Calif.

[21] Appl. No.: 435,002

[22] Filed: Nov. 9, 1989

[51] Int. Cl.⁵ .............................................. H03N 7/26
[52] U.S. Cl. .................................... 341/109; 371/39.1; 360/39; 341/94
[58] Field of Search ................... 341/715, 89, 94, 109; 360/39, 40; 371/37.1, 38.1, 39.1

[56] References Cited

U.S. PATENT DOCUMENTS

| | | | |
|---|---|---|---|
| 3,465,287 | 9/1969 | Kennedy et al. | 371/39.1 |
| 4,462,052 | 7/1984 | Kaplinsky | 360/39 |
| 4,698,813 | 10/1987 | Erdel | 371/39.1 |
| 4,771,429 | 9/1988 | Davis et al. | 371/37.1 |

Primary Examiner—William M. Shoop, Jr.
Assistant Examiner—Marc S. Hoff
Attorney, Agent, or Firm—Richard P. Berg; E. H. Valet

[57] ABSTRACT

A circuit for randomizing data or de-randomzing previously randomized data according to a randomization scheme utilizing an irreducible generator polynomial which operates on a serial bit stream of words of data which is supplied to said circuit in a format, either LSB or MSB first, different from the format according to which the data was previously randomized or will be subsequently de-randomized. The circuit includes means for generating said irreducible generator polynomial; means for triggering said generating means in a given direction in response to a clock signal; means for exclusively ORing the contents of a bit in said generating means with a bit in said bit stream; and means for periodically interrupting said triggering means and instead setting the state of said generating means a predetermined number of states in a direction effectively the opposite to which said generating means normally generates data.

22 Claims, 24 Drawing Sheets

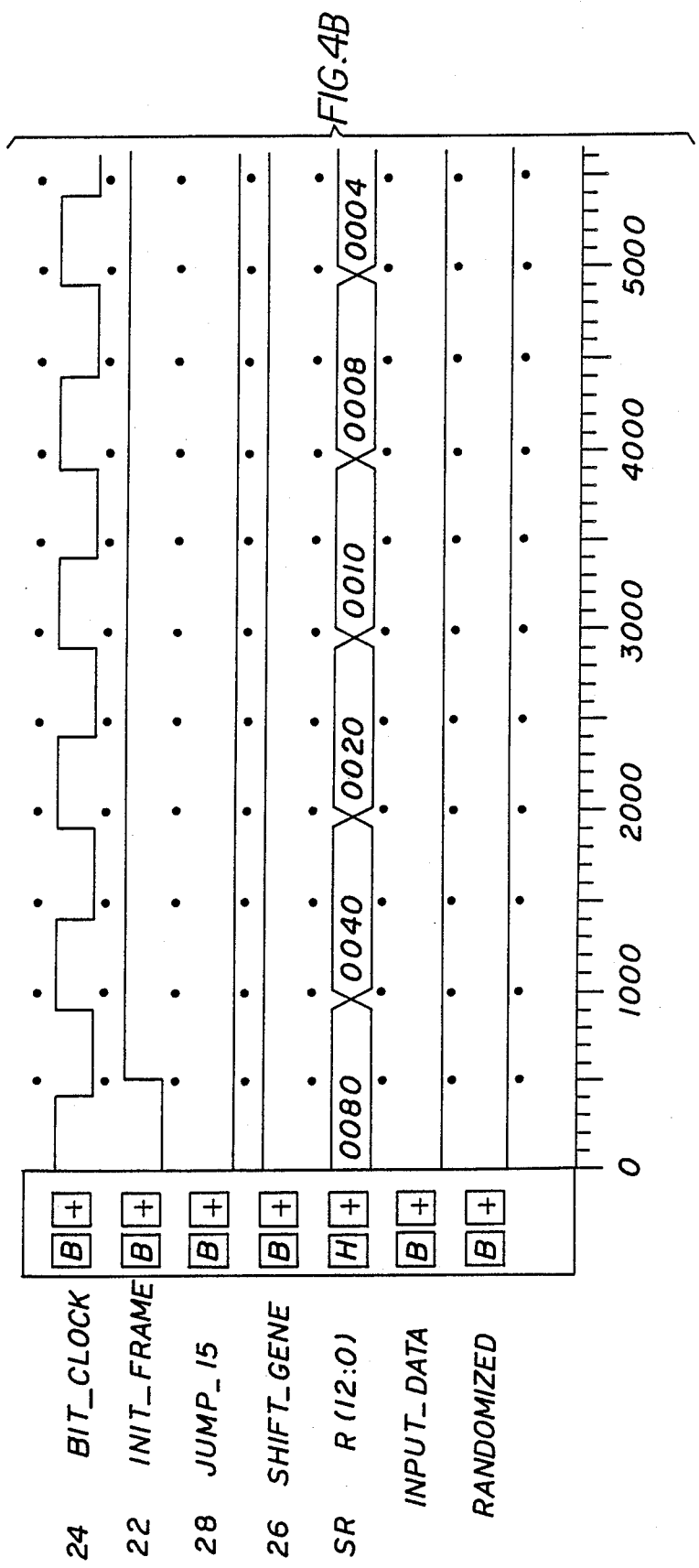

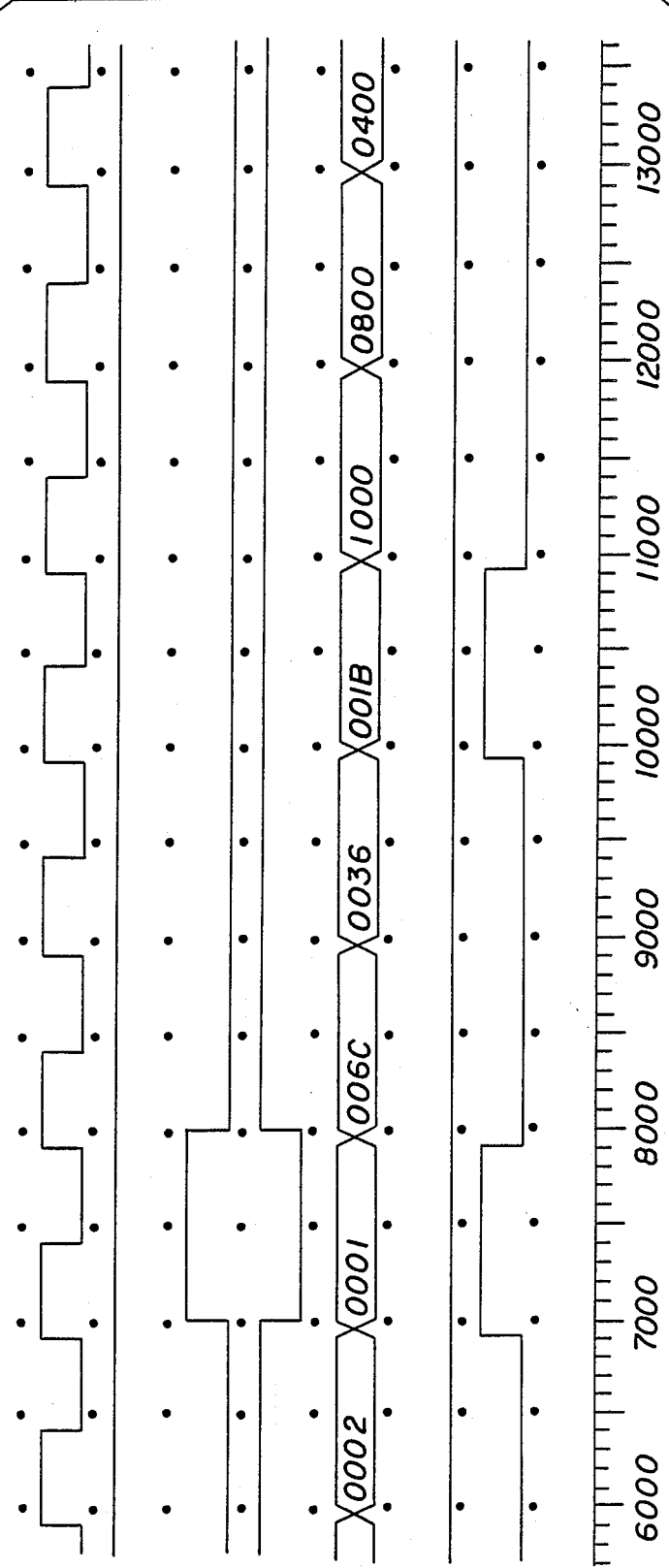

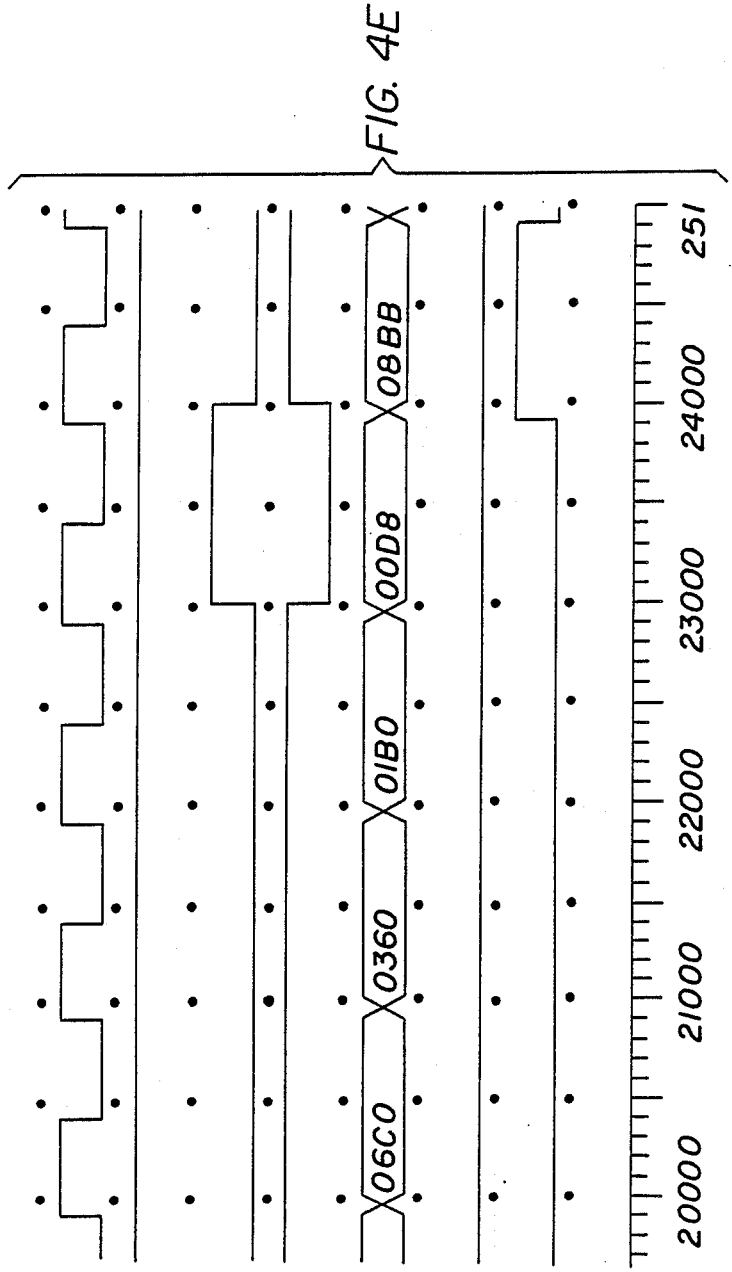

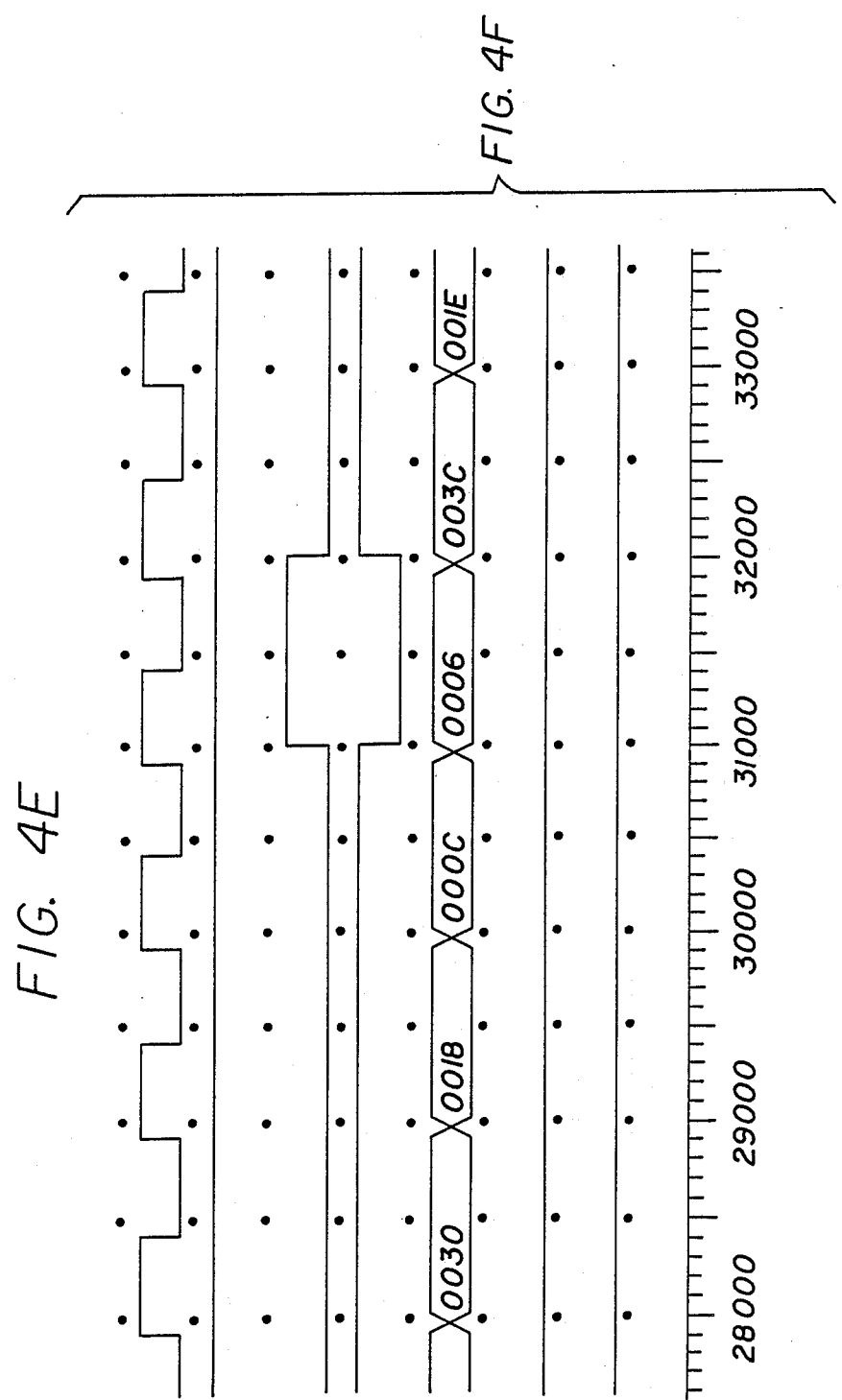

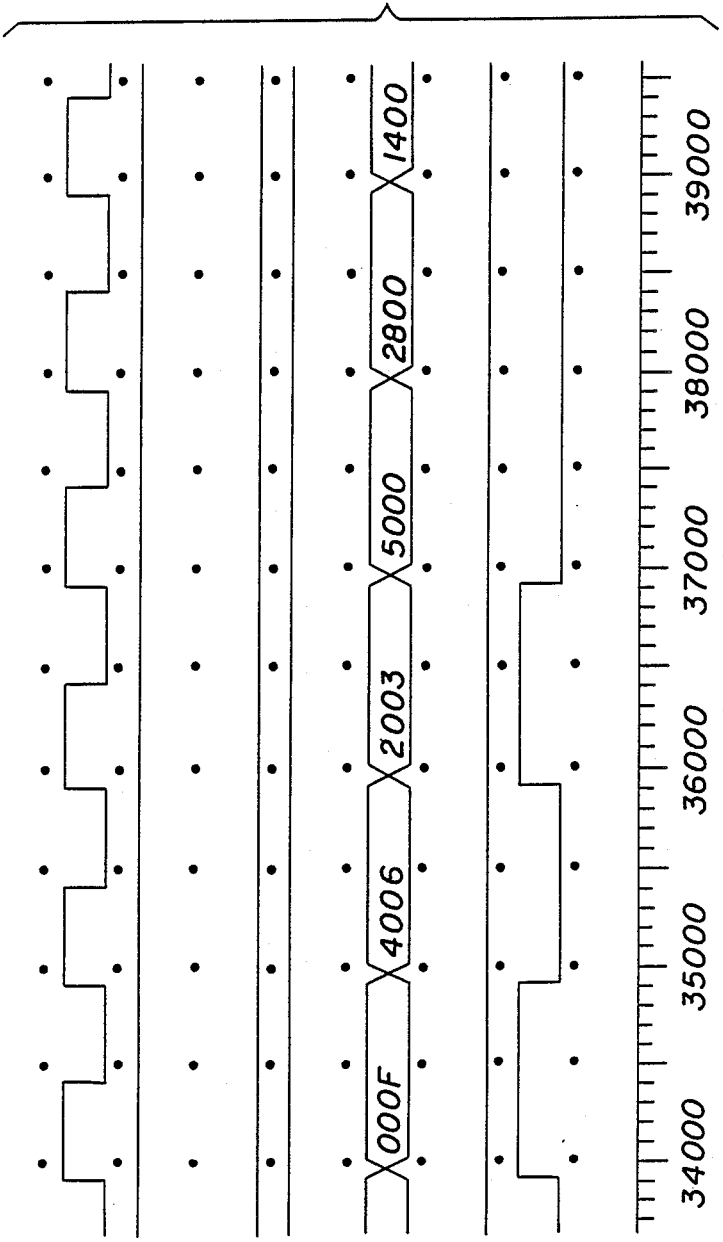

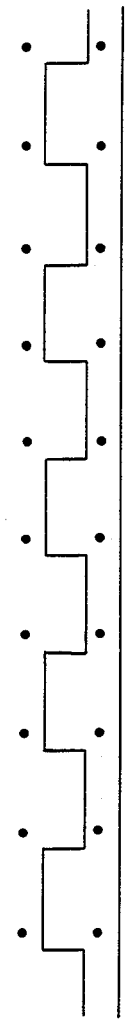
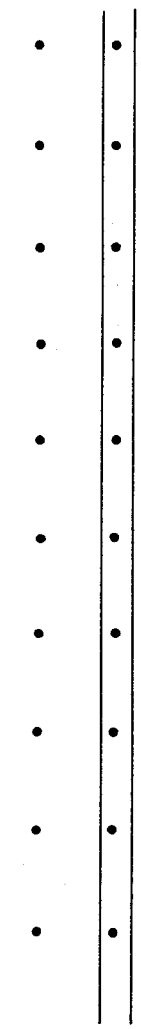
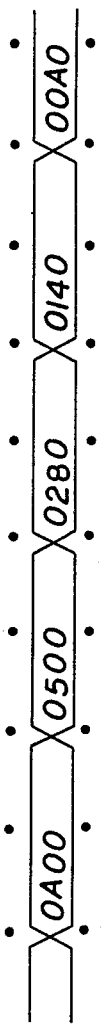
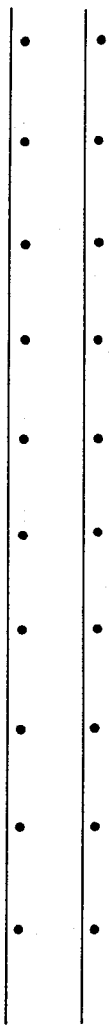
FIG. 4G
FIG. 4H

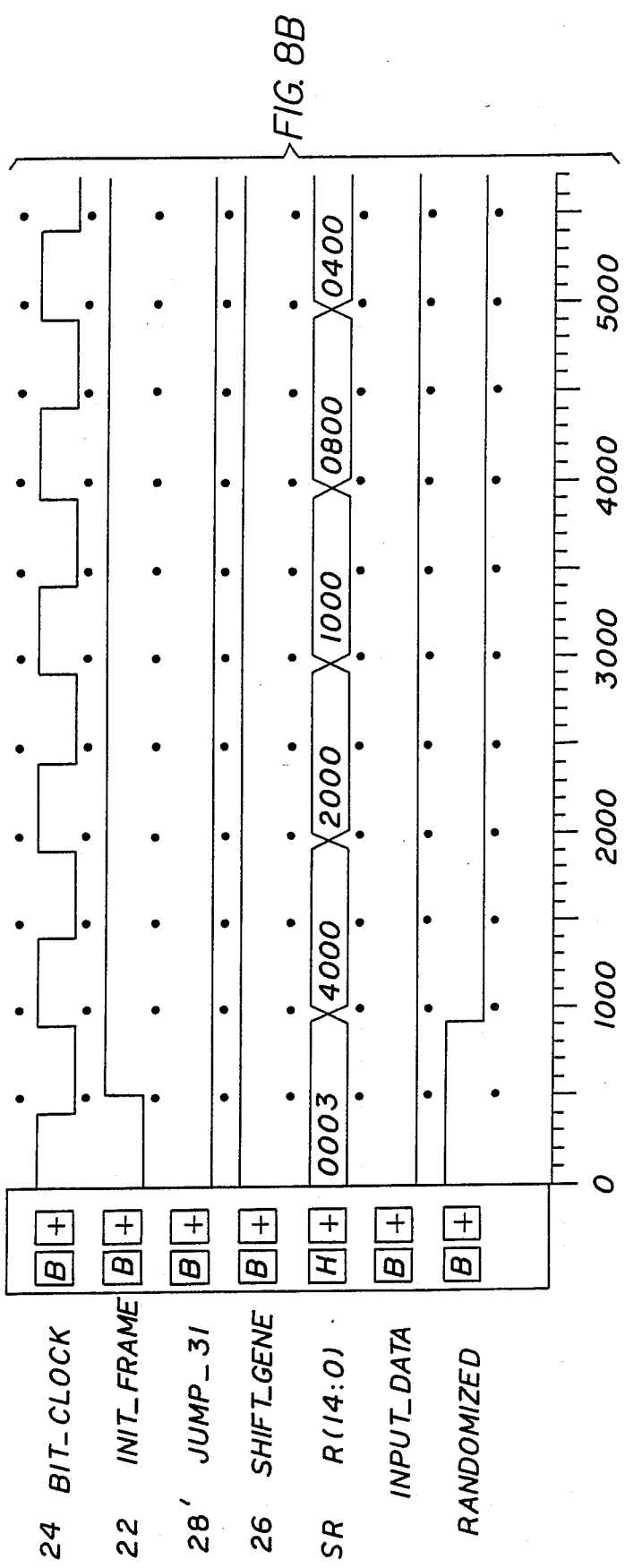

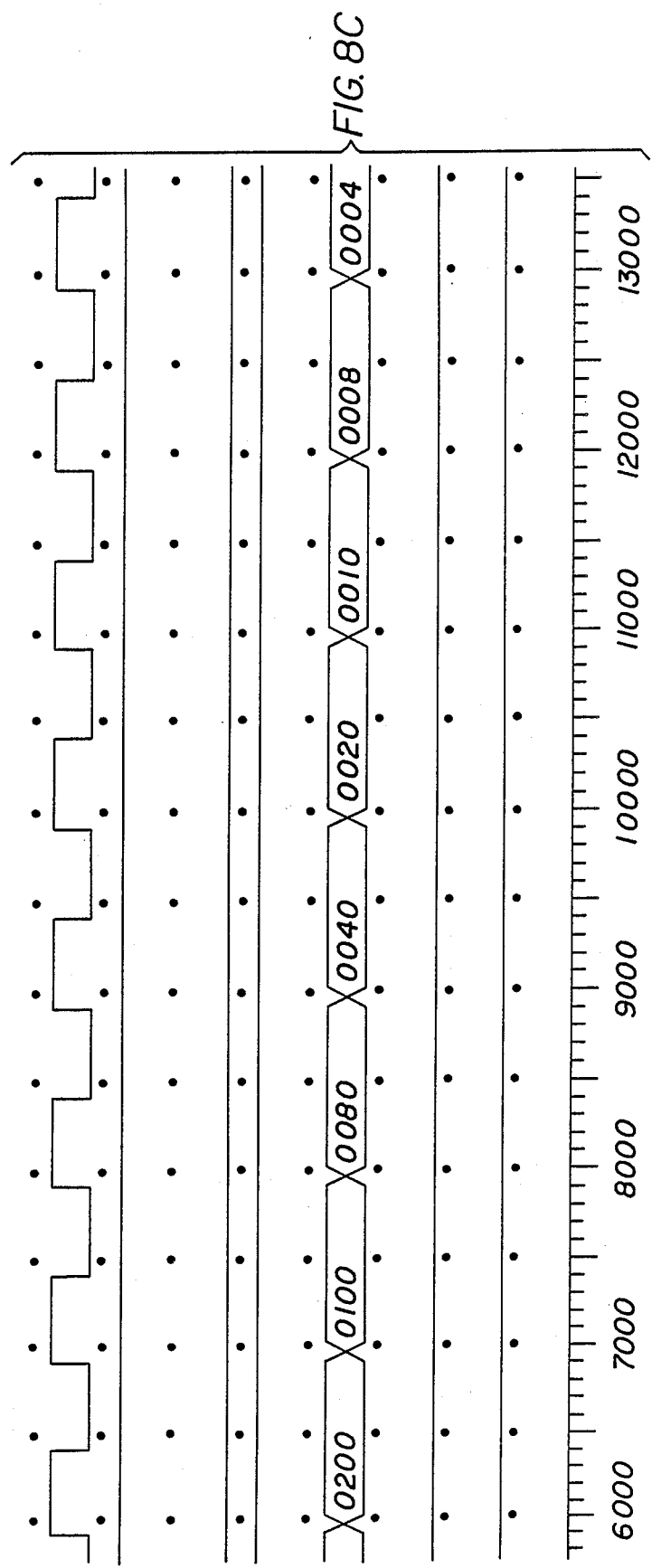

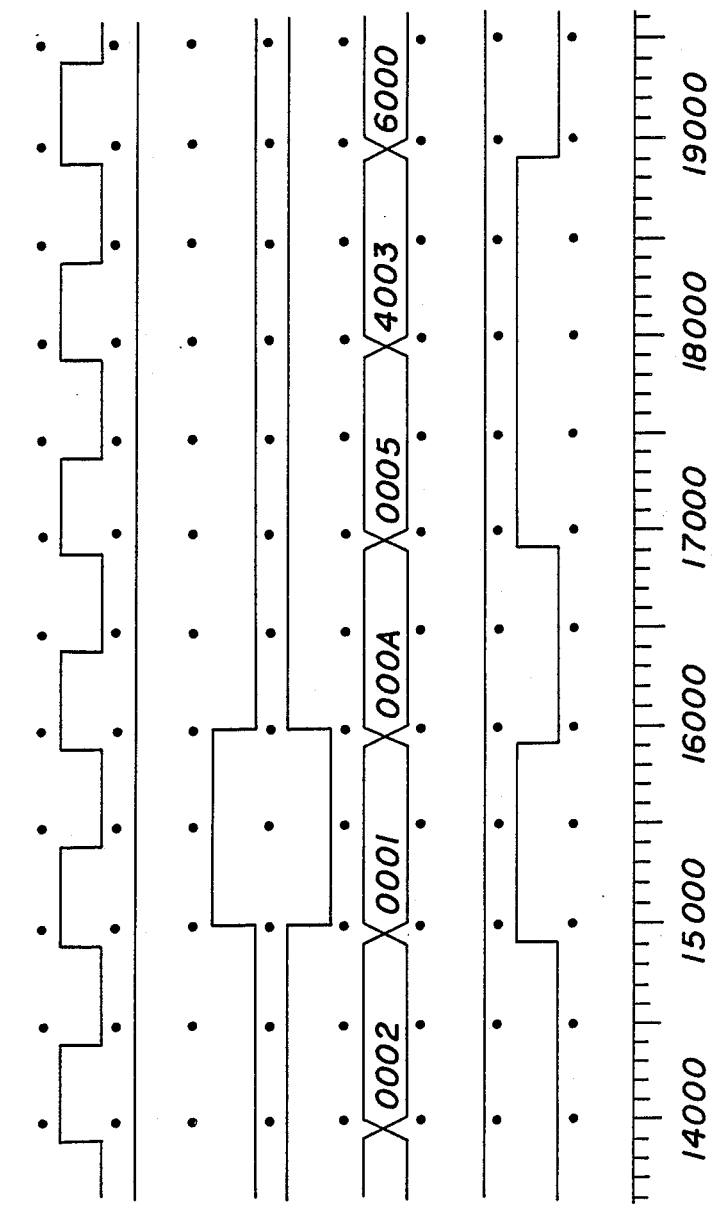

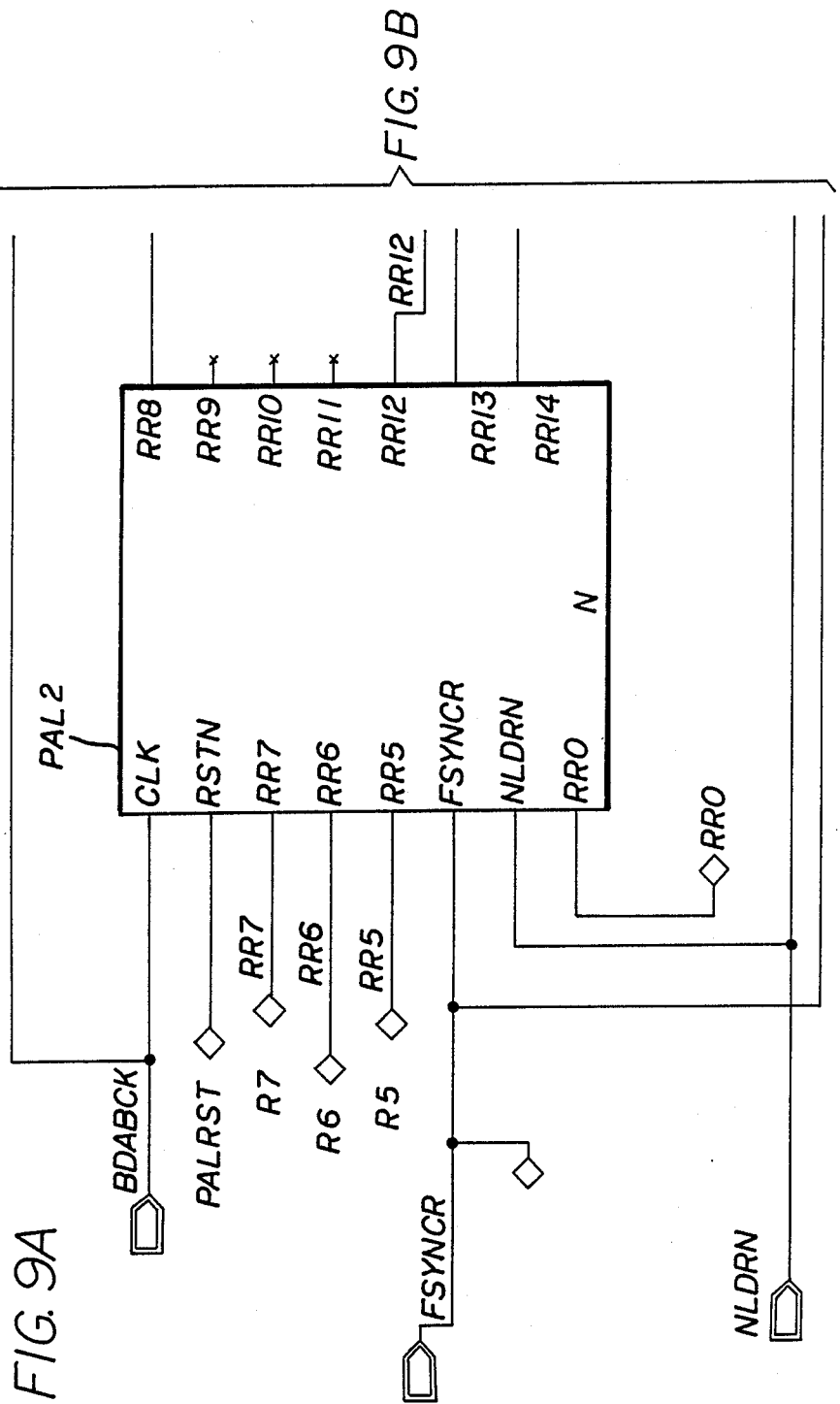

DATA RANDOMIZING/DE-RANDOMIZING CIRCUIT FOR RANDOMIZING AND DE-RANDOMIZING DATA

TECHNICAL FIELD OF THE INVENTION

The present invention relates to a data randomizing circuit for randomizing data or for de-randomizing previously randomized data. Data randomization and de-randomization is often used where there is concern for the integrity of data which is either recorded and/or transmitted. Circuits which randomize and de-randomize data can be used in connection with devices for recording data on magnetic media, devices for transmitting data over communication lines (such as a modem), and the like.

BACKGROUND OF THE INVENTION

The use of data randomization and de-randomization techniques are well known in the prior art. However, for those who are not intimately familiar with this technology, the following information is provided.

The term "randomization" as it is used in connection with this technology, is somewhat of a misnomer. To the uninitiated, one might think that you would not want to "randomize" data before recording it on magnetic media or transferring it over a modem since such "randomization" seemingly render the data completely useless to the recipient. There are, however, there are good reasons to "randomize" the data, so long as the original data can be recovered later.

When data is recorded to magnetic media or is transferred by modem, it is transferred usually in a serial bit stream as a series of multi-bit words. The number of bits in each word can be 8, 16, 32, 64, or whatever. That is not important here. What is important is that when all the words are serially arranged, depending upon the type of data being transmitted, there may be long groups or strings of ones or zeros or long strings of repeating patterns of one and zeros which make up the serial data.

In the art of storing and transmitting data, the lost of data is basically an occupational hazard and therefore techniques have been developed to recover lost or missing data. For example, to improve data integrity, it is known to use error correction coding techniques, parity bits and the like. One of the problems associated with magnetic recording techniques, for example, is that this technology is more apt to have difficulty in reading the previously stored data if that data consists either of a long string of ones, a long string of zeros or a long string of repeating patterns of ones and zeros. Data randomization strives to avoid this problem by changing the state of selected bits in the words of transmitted data in a preselected pattern. Since preselected bits are changed, long strings of data originally having a repeating pattern (i.e., all ones, all zeros or a pattern of ones and zeros) no longer exhibit that repeating pattern, especially if the preselected pattern does not itself have a pattern which repeats quickly. Thus, so long as the preselected pattern is known, then the bits can be switched again when they are received at the receiving end of a modem or read off of magnetic media, to put the data back into its original form. Thus, data randomization is concerned with the randomizing of the data, that is, the switching of the state of selected bits in a preselected pattern, to try to avoid having long instances of data which appears in a pattern. Data de-randomization is the reversal of that process. The data is randomized before it is recorded to magnetic media or before it is transmitted by modem and then is de-randomized after it is read off of magnetic media or after it is received by a receiving modem.

The preselected pattern which is used is usually some sort of a pseudo-random pattern of the type generated by an irreducible generator polynomial. Irreducible generator polynomials are used because they can be rather simply implemented using a shift register circuit of the type shown in FIG. 1. Indeed, the shift register implementation of FIG. 1 is used to randomize, or derandomize, for that matter, the data in a serial bit stream according to the following polynomial:

$$g(x) = x^{15} + x + 1.$$

The shift register implementation of FIG. 1 generates the sequence of data set forth in Table I. This particular randomizer is particularly useful in connection with storing tape on digital audio tape (DAT). For a better understanding of DAT technology, the reader is directed to the following articles, all of which are incorporated by reference herein: (1) *Isn't DAT Special?* by Bert Vermueulen and Mike Law, published in the Dec. 1988 issue of Mini-Micro Systems; (2) *DAT for Data* by J. Young and Eng Tan, published in the Feb. 1988 issue of Systems International, Reed Business Publishing; (3) *All Present and Correct* by Eng Tan and Mark Dunstan in the Feb., 1988 issue of Systems International, Reed Business Publishing; and (4) *DAT Data Format Takes Shape* by Pete Bramhall and Mark Dunstan, in the Mar. 1988 issue of Systems International, Reed Business Publishing.

Turning to the randomizer of FIG. 1, if it is initialized to 000 0000 0000 0001 at the beginning of each frame and bit 0 of the randomizer is exclusively ORed (XORed) with the incoming bit stream, least significant bit (LSB) first, prior to recording or transmitting, the data will be randomized, that is, selected bits in the incoming data stream will have their states switched so that the selected bits will either go from a one to a zero or a zero to a one, whenever a binary one is outputted from bit 0 ($SR_0$) of the shift register. Those skilled in this art will appreciate that one the shift register has been initialized, it will count continuously, changing state in a predetermined pattern and thus predetermined bits in the incoming serial bit stream will change state by the action of the XOR gate 20, thereby helping to ensure that long strings of ones or long strings of zeros or long strings of repeating patterns of ones and zeros of data will not likely occur.

After the data has been transmitted or stored, the randomized data can be played through an identical randomizer to that of FIG. 1 and the original data pattern will be recovered. That is to say, exactly the same shift register implementation can often be used to both randomize and de-randomize the data. In the randomization process the preselected bits are caused to change state when a binary one is outputted from the shift register into an exclusive OR (XOR) gate 20, which also receives the incoming data. XOR gate 20 then inverts bits of data on line 30 whenever the shift register outputs a logical one. In the derandomization process those same preselected bits are caused to switch back (i.e. they are inverted again) to their original state when a binary one is outputted from the shift register and into exclusive OR gate 20 which then acts upon the previously randomized data. Thus, the original data is recovered.

The circuitry of FIG. 1 assumes that the input data which is to be randomized or de-randomized arrives least significant bit (LSB) first. Unfortunately, in the hardware world, there are two points of view, namely, that serial data should be supplied least significant bit (LSB) first, or that it should be supplied most significant bit (MSB) first. The various hardware manufactures have differing views as to which scheme, LSB first or MSB first, should be used. Since two different pieces of hardware built by different manufacturers may have to deal with the data randomization and de-randomization processes, if one piece of hardware works LSB first and the other works MSB first, then the randomizer shown in FIG. 1 cannot be used in both pieces of equipment. Otherwise, instead of first randomizing and then de-randomizing the data, the shift register would perform two randomization processes, one upon the data LSB first and thereafter upon the data MSB first. That would, of course, render the data doubly randomized and therefore basically useless.

It is an object therefore, of the present invention, to provide a randomizer which can be operated backwards compared to the randomizer shown in FIG. 1. That is to say, if the randomizer of FIG. 1 is used with LSB first data, it is an object of the present invention to provide a randomizer which can be used with MSB first data (or visa versa), and to randomize (or de-randomize) the data such that the randomization process is equivalent to randomization (or de-randomization) done on LSB first data (or visa versa).

BRIEF DESCRIPTION OF THE INVENTION

The present invention provides an apparatus for randomizing data or de-randomizing previously randomized data according to a randomization scheme utilizing an irreducible generator polynomial which operates on a serial bit stream of words of data which is supplied to said circuit in a format, either LSB or MSB first, different from the format according to which the data was previously randomized or will be subsequently de-randomized. The apparatus includes a memory for generating the irreducible generator polynomial and a circuit for propagating data in a given direction in response to a clock signal. An exclusive OR gate exclusively ORes the contents of a bit in the memory with a bit in the bit stream. Also, a circuit is provided for periodically interrupting the usual propagation of data and instead sets the state of the memory a predetermined number of states in a direction effectively the opposite to which the memory normally generates data.

The present invention also provides a method of electronically randomizing data or de-randomizing previously randomized data according to a randomization scheme utilizing an irreducible generator polynomial which operates on a serial bit stream of words of data which is supplied to said circuit in a format, either LSB or MSB first, different from the format according to which the data was previously randomized or will be subsequently de-randomized. The method comprises the steps of (a) shifting the contents of a memory device in response to a clock signal in a given direction, the memory device being arranged to generate said irreducible generator polynomial; (b) exclusively ORing the contents of a bit in said memory device with a bit in said bit stream; and (c) periodically interrupting the shifting of said shifting step and instead setting the state of said memory device a predetermined number of states in a direction effectively the opposite to which said memory device normally propagates in response to said shifting step, said interrupting and setting step occurring once every N states, where N equals the number of bits in a word in said serial bit stream and wherein said predetermined number of states equals $2N-1$.

BRIEF DESCRIPTION OF THE FIGURES

FIGS. 4A to 4H form a timing diagram for the logic diagram of FIGS. 3A, 3B, and 3C.

FIGS. 9A to 9B are a diagram of a third embodiment of the present invention, incorporating Programmed Logic Arrays in place of discrete digital logic.

BRIEF DESCRIPTION OF THE TABLES

Table I shows the data sequence generated by the polynomial $g(x)=x^{15}+x+1$ at clock cycles 0 through 23;

Table II shows the data sequence which must be generated by a backward randomizer of the polynomial $g(x)=x^{15}+x+1$ for clock cycles 0 through 31;

Table III shows the solution of $S(x)=x^{31} R(x) \text{ MOD } g(x)$;

Table IV set out in detail the first two division steps in Table III;

Table V shows the data sequence generated by the polynomial $g(x)=x^{13}+x^4+x^3+x+1$ at clock cycles 0 through 23;

Table VI shows the data sequence which must be generated by a backward randomizer of the polynomial $g(x)=x^{13}+x^4+x^3+x+1$ for clock cycles 0 through 23;

Table VII shows the solution of $S(x)=x^{15} R(x) \text{ MOD } g(x)$;

Table VIII sets forth the relationship in the signal names for the First and Third Embodiments;

Table IX sets forth the logic equation descriptions of PAL1 and PAL2;

Table X sets forth a reduced to canonical form of the equation description of Table IX;

Table XI shows the same information as does Table X, except that now it is in terms of PAL pin numbers;

Table XII set forth the relationship between PAL pin numbers and the names of the logic signals appearing on those pins.

DETAILED DESCRIPTION

First Embodiment of the Invention

Figure 1:
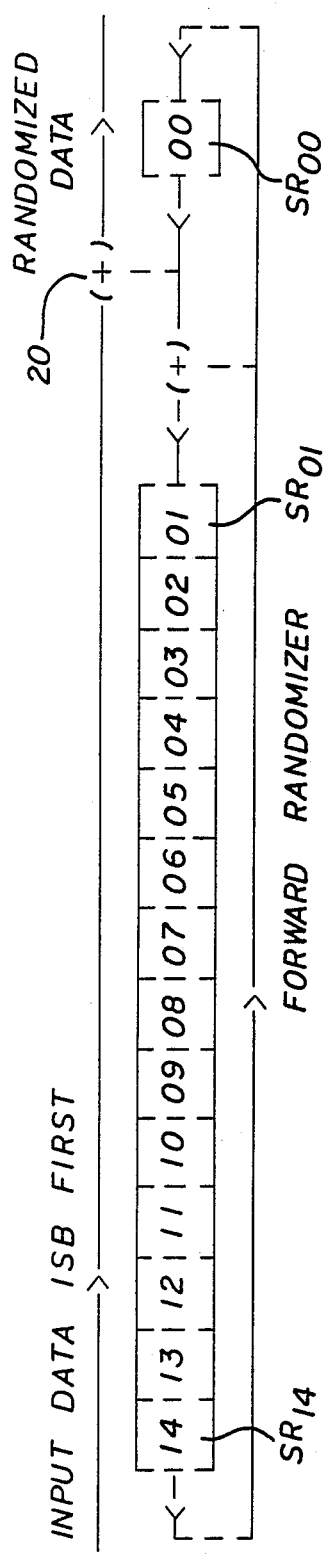
FIG. 1 is a diagram of a conventional shift register implementation for generating the field elements according to an irreducible generator polynomial of the type $g(x)=x^{15}+x+1$.

FIG. 1 depicts a conventional shift register implementation for generating the field elements according to the following irreducible generator polynomial:

$$g(x) = x^{15} + x + 1.$$

The shift register has fifteen single bit register cells $SR_{00}$ through $SR_{14}$. Those skilled in the art will appreciate that such a shift register can be implemented by a series of flip flops. Register cell $SR_{00}$ receives the output from register cell $SR_{14}$. The output of register cell $SR_{14}$ is exclusively ORed with the output from register cell $SR_{00}$ which is then supplied as an input to register cell $SR_{01}$. Register cell $SR_{01}$ provides input for register cell $SR_{02}$ which in turn provides input for register cell $SR_{03}$. The remaining registers cells $SR_{03}$ through $SR_{14}$ are similarly series connected. The output of register cell $SR_{00}$ is also exclusively ORed with the input data LSB first data in order to provide the initial randomization. The same circuitry can subsequently de-randomization the data, assuming that the incoming serial bit stream is still arriving LSB first. The arrangement shown in FIG. 1 may be known as a forward randomizer.

The randomizer of FIG. 1 generates the data sequence shown in Table I. The forward randomizer is initiated to the binary value 000 0000 0000 0001 at the beginning of each frame, if used to randomize (or de-randomize) data in DAT applications or at some other convenient data boundary in other applications. The manner in which the bit shifts through shift register SR can be seen for clock cycles 0 through clock cycle 23 in Table I. At clock cycle 15, a logical one is inputted into both register cells $SR_{00}$ and $SR_{01}$ due to the action of the exclusive OR gate connected therebetween and thus the count in the shift register then becomes: 000 0000 0000 0011. If the forward randomizer were clocked through all of its possible states, it would take 32,767 clock cycles for the forward randomizer to clock through all of its possible states. The randomizer produces a unique binary number for each of those 32,767 clock cycles, and since the binary numbers which are generated do not appear in a normal counting sequence, but rather somewhat randomized, but predetermined sequence, the sequence of numbers generated is commonly called "pseudo-random".

The particular randomizers described in detail herein are intended to be used with digital audio tape (DAT) where the data is stored as sixteen bit words, but those skilled in the art will appreciate that the general type of randomizer disclosed herein may be used in a number of different applications and with different word lengths. In digital audio tape, the data is stored in frames, with each frame containing 5,760 eight bit bytes or 46,080 bits spread evenly over two tracks which each contain 2,880 eight bit bytes or 23,040 bits. Two eight bit bytes form one sixteen bit word. Thus, the fifteenth degree polynomial described above does an adequate job of randomizing data to be stored on a DAT device since the period of the randomizer is longer than the length of the data in the frame, so that the repeating pattern of the randomizer goes unnoticed.

Figure 2:
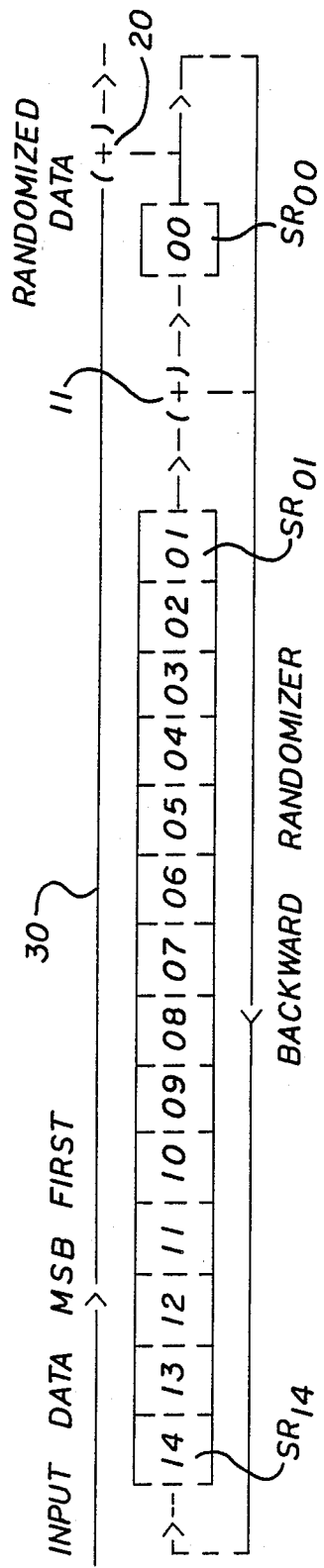
FIG. 2 is a diagram of a shift register similar to the shift register of FIG. 1, but arranged to count backwards compared to the shift register depicted in FIG. 1.

In the case where the incoming bit stream is available only most significant bit (MSB) first, and the same randomization (or de-randomization) as done by the circuitry of FIG. 1 is to be accomplished, then the randomizer must be run backwards, as will now be seen. Turning to FIG. 2, the randomizer here has the same number of cells (fifteen) as the randomizer of FIG. 1, and so it includes register cells $SR_{00}$ through $SR_{14}$, which here are preferably implemented by flip flops. In this embodiment, the output from flip flop $SR_{02}$ is exclusively ORed with the output from flip flop $SR_{01}$ by XOR gate 11 to provide an input to flip flop $SR_{00}$. The output from flip flop $SR_{00}$ also supplies the input to flip flop $SR_{14}$ and further it is XORed with the incoming data stream on line 30 at gate 20. Flip flops $SR_{14}$ through $SR_{01}$ are connected serially as is depicted in FIG. 2. It should be noted that the data in the shift register SR of FIG. 2 propagates backwards (clockwise as depicted) compared to the shift register SR of FIG. 1 (which runs counterclockwise as depicted).

Table II shows how the data must be clocked through the backward randomizer of FIG. 2. Since the initial bit of the incoming serial data on line 30 comes MSB first, the initial bit is, assuming sixteen bit words, bit 15 as opposed to bit 0. In order to correctly randomize (or de-randomize) the data, at clock 0, the contents of the backward randomizer of FIG. 2 must be initialized to the same contents as the contents of the forward randomizer of FIG. 1 had for the fifteenth bit at clock 15 (see Table I). As can be seen by reference to Table I, when the forward randomizer sees bit 15 at clock 15, the contents of the shift register is 000 0000 0000 0011 (or $0003_{16}$ in hexadecimal). Thus, at clock 0, the backwards shift register of FIG. 2 must be initialized to the aforementioned value, namely $0003_{16}$. If the randomizer of FIG. 2 is then run backwards as shown, then at clock 1, the hex value $4000_{16}$ will appear in the shift register SR for bit number 14 which is the correct value for encoding or decoding input bit number 14 as can be seen by reference to input bit number 14 at clock 14 for the forward randomizer of FIG. 1 and Table I.

As the backward randomizer randomizers (or de-randomizes), the inputted MSB first data from bit 15 through bit 0 during clock cycles 0 through 15, the data is correctly randomized (or de-randomized). However, at the very next clock cycle, namely, at clock 16, the contents of the backward randomizer must be set ahead so that it is then ready to decode input bit number 31. Since it just decoded input bit number 0 at clock 15, this is a jump of thirty-one bits from the immediately preceding state of the backward randomizer. This means, in effect, that for each sixteen clock cycles, the contents of the backward randomizer must be reinitialized to a new value, which is in effect thirty-one states ahead from its immediately preceding state, assuming, of course, that sixteen bit data is used. This is a set ahead of thirty-one states from the state R(x) of the backward randomizer. This set ahead state, S(x), is given by the following formula:

$$S(x) = x^{31} R(x) \text{ MOD } g(x)$$

which can be evaluated by long division as follows and as shown in Table III.

In Table III, the coefficient of bit 0 is identified by the letter "Z" while the coefficient of bit 1 is identified by the letter "O" so that the numbers "0" and "1" can be used to represent ordinary binary values. Otherwise, the terms "2" through "9" and "A" through "E" represent bit 2 through and including bit 14 (there is no bit 15 since the we are here using a fifteenth degree polynomial and the shift register SR therefore only has 15 cells or bits represented by bit numbers 0 through 14).

To accomplish the long division, R(x) is first shifted left by 31 bits. Then that value is divided by the generator polynomial g(x) using 2's complement division, without carry, where addition and subtraction and both replaced by an exlusive OR operation. To illustrate the division procedure, the first two division steps in Table III are set out in detail in Table IV.

The equations for the 31 bit set ahead may now be written as follows:

$$e = D + B$$

$$d = C + A$$

$$c = B + 9$$

$$b = A + 8$$

$$a = 9 + 7$$

$$9 = 8 + 6$$

$$8 = 7 + 5$$

$$7 = 6 + 4$$

$$6 = 5 + 3$$

$$5 = 4 + 2$$

$$4 = 3 + O$$

$$3 = 2 + Z + E$$

$$2 = O + E + D$$

$$0 = Z + D + E + C$$

$$z = E + C$$

where + is taken to indicate an exclusive OR operation, the term to the left of the equals sign indicates the set ahead values and terms to the right of equals sign indicate the old backward generator values.

The elements for the foregoing equations can be found in Table III as follows. At the bottom of the table are set forth the coefficients "e" through "z" of S(x). For each coefficient, consider the column of terms immediately above it, ignoring the zeros (0) and furthermore any terms which appear twice (since exclusive ORing with the same term has no effect). Thus for the coefficient "e" the terms DCCB are found in the column immediately above that term, reading downward. Since the two "C" terms can be ignored, the resulting equation is simplified to $e = D + B$. For the coefficient "d", the terms CBBA are found, resulting in the simplified equation $d = C + A$. The other coefficient are found in the same manner.

Figure 3A:
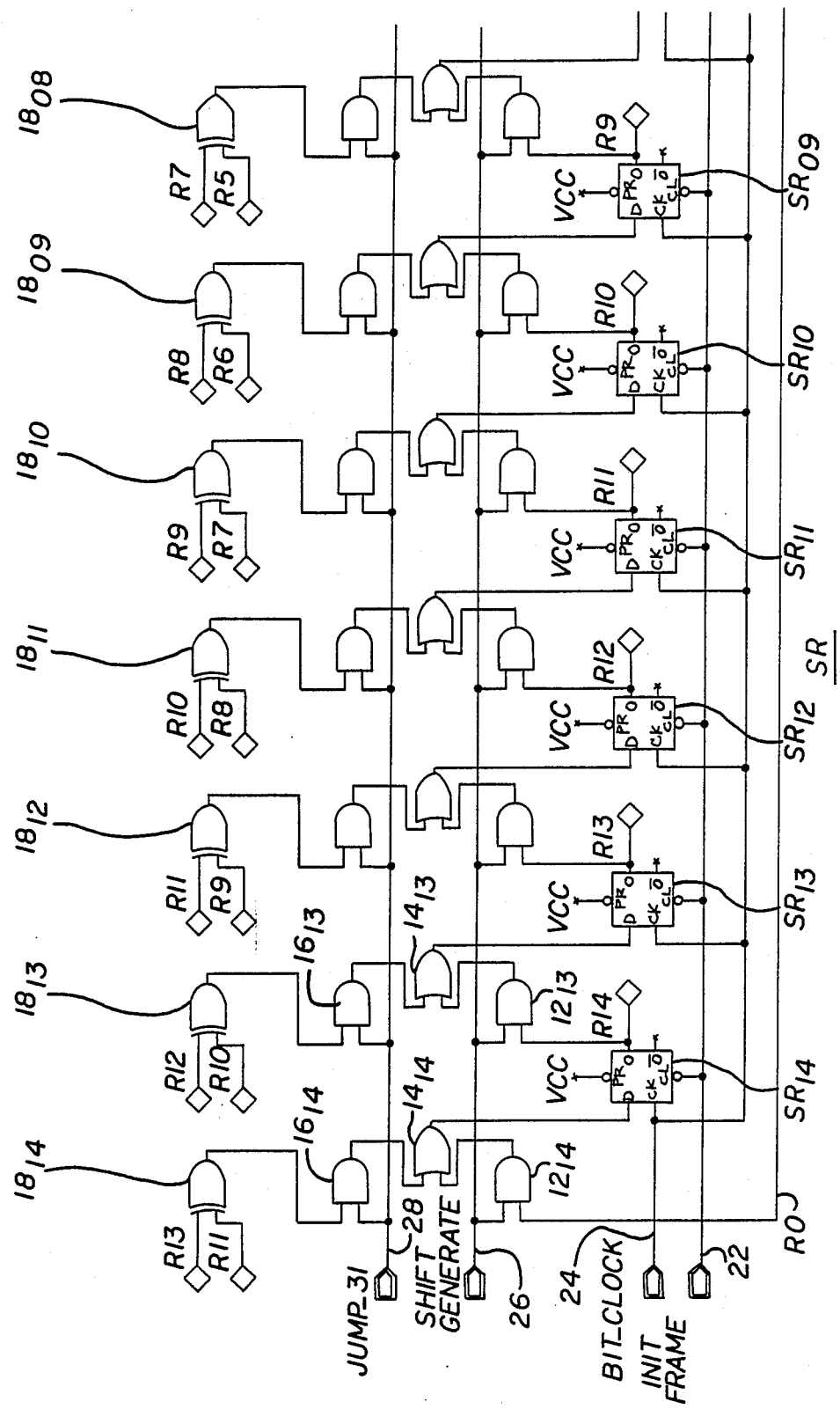
FIGS. 3A, 3B, and 3C form a logic diagram of a backwards running shift register with exclusive OR logic producing a thirty-one bit jump every sixteen clock cycles.
Figure 3B:
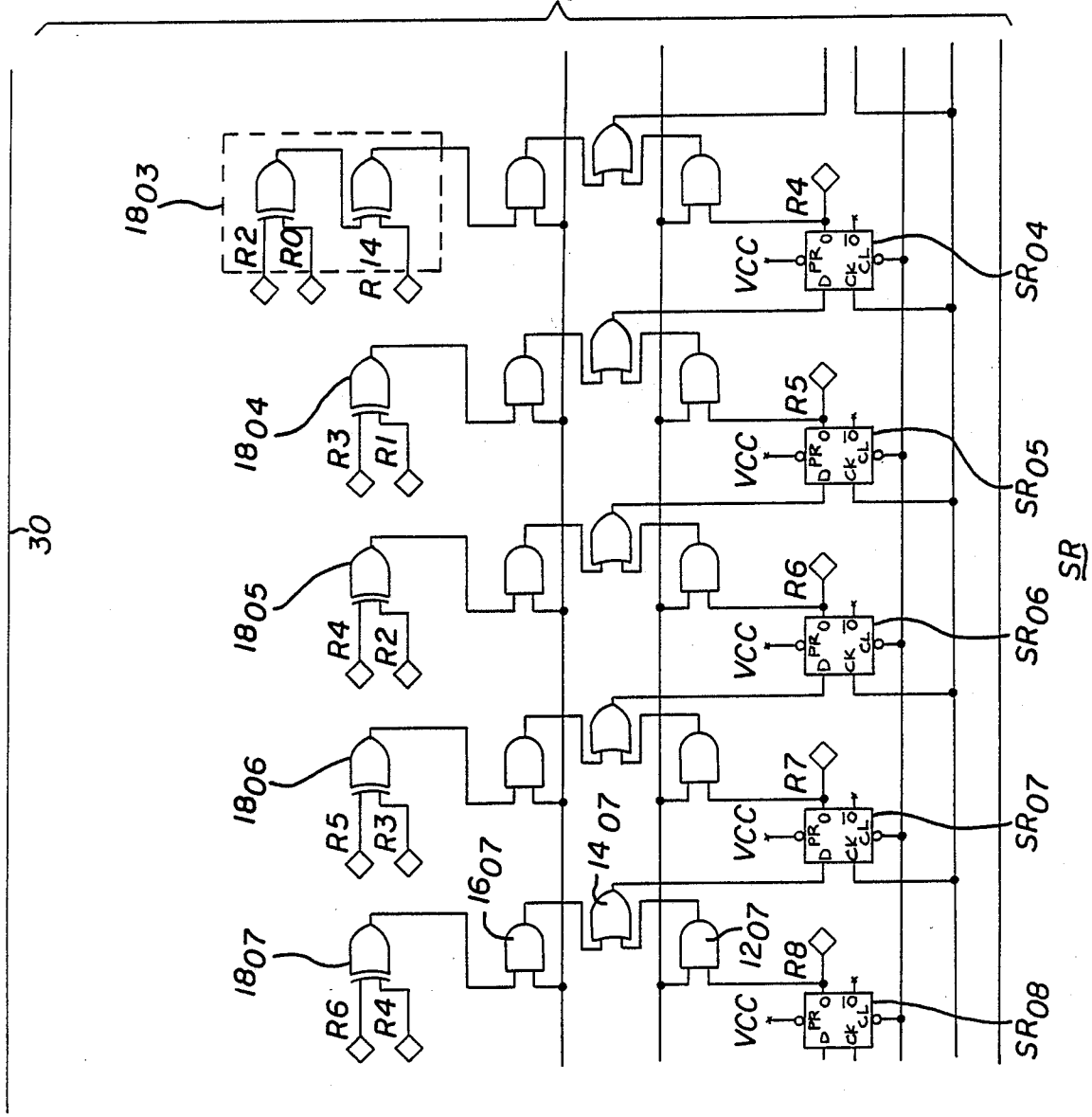
Figure 3C:
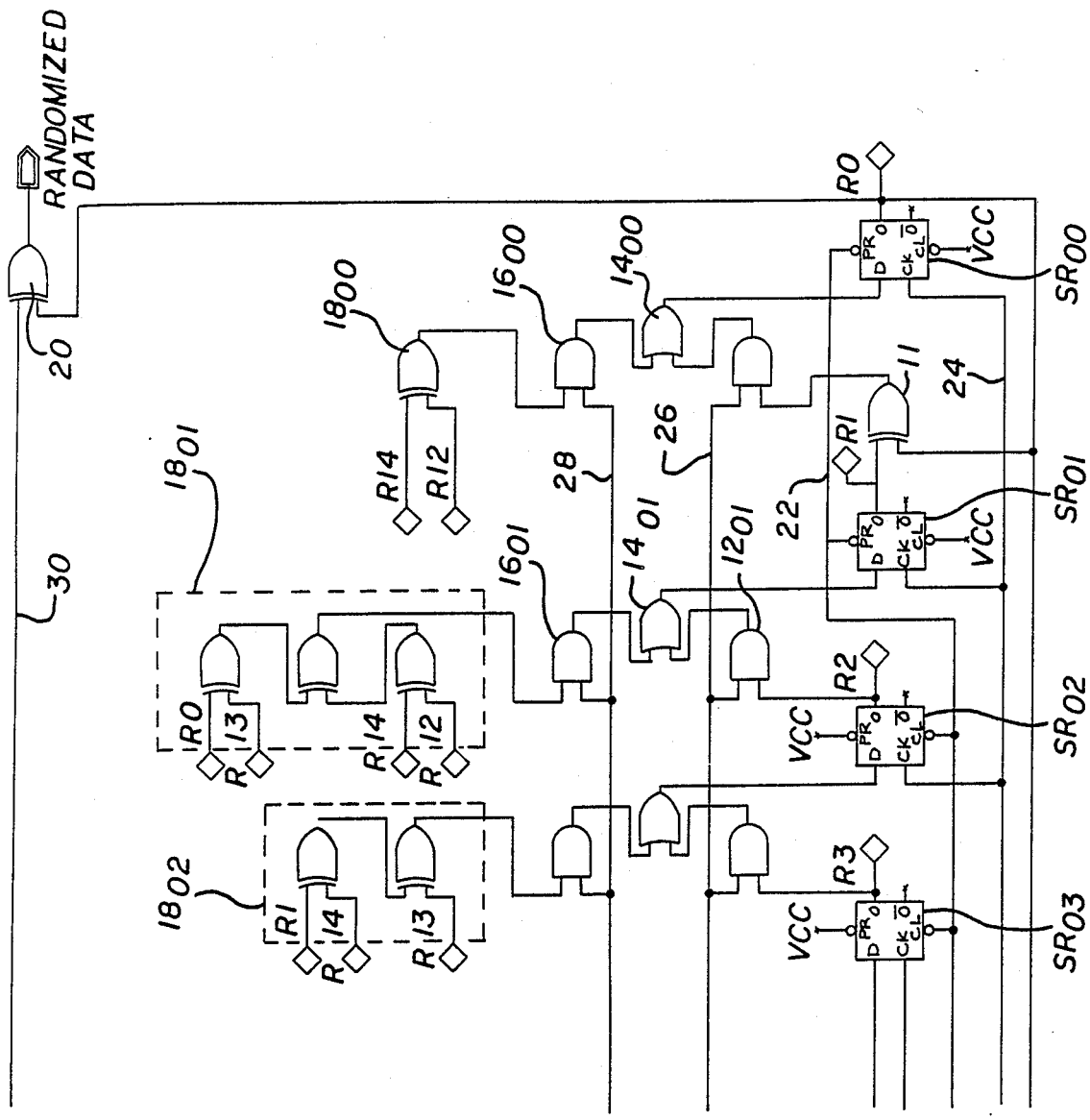

FIG. 3A, 3B, and 3C form a logic diagram, which is hereinafter referred to as FIG. 3. This logic diagram shows a shift register SR with XOR logic which implements the foregoing solutions to the equation $S(x) = x^{31}$ R(x) MODg(x). In the actual circuit implementation, the signals on lines R14 through R0 replace the signals e through z in the solutions to the equation $S(x) = x^{31}$ R(x) MODg(x). Here the backward randomizer again is set up to generate a fifteen degree polynomial, but according to the pattern shown in Table II. The individual flip flops which make up the shift register, are identified as flip flops $SR_{00}$ through flip flop $SR_{14}$. At the beginning of a frame, the shift register is initialized by a signal, INIT_FRAME, on line 22 so as to force the shift register $SR_{00}$ $SR_{14}$ to initialize to the value $0003_{16}$. Thereafter, the contents of the shift register is shifted by a clock applied to line 24. The contents of the "Q" output of each flip flop stage is communicated to its neighboring stage via a pair of gates 12 and 14. In the case of flip flop $SR_{01}$, its output R1 is exclusively ORed at XOR gate 11 with the "Q" output R0 from flip flop $SR_{00}$, and the output of XOR gate 11 is applied via an AND gate $12_{00}$ and an OR gate $14_{00}$ to the "D" input of flip flop $SR_{00}$. Gates $12_{14}$ through $12_{00}$ (collectively referred to as AND gates 12) are enabled by a signal, SHIFT_GENERATE, on line 26 which goes high to turn on AND gates 12 and permit the backward shifting pattern to occur through the shift register SR. The output from each AND gate $12_{14}$ through $12_{00}$ is applied to an associated OR gate $14_{14}$ through $14_{00}$ (collectively referred to as OR gates 14) to the "D" input of their associated flip flop. Gates 12 and 14 are identified in FIG. 3 with a subscript identical to the subscript of the shift register SR cell of stage which they control.

The output of flip flop $SR_{00}$ is exclusively ORed with the incoming serial data stream on line 30 by XOR gate 20. The output of flip flop $SR_{00}$ is also applied to the input of flip flop $SR_{14}$ via AND gate $12_{14}$ and OR gate $14_{14}$. The output of flip flop $SR_{14}$ is applied to the input of its neighboring, lower order flip flop $SR_{13}$ via AND gate $12_{13}$ and OR gate $14_{13}$ and the remaining flip flops are similarly connected.

Figures 4C, 4D:
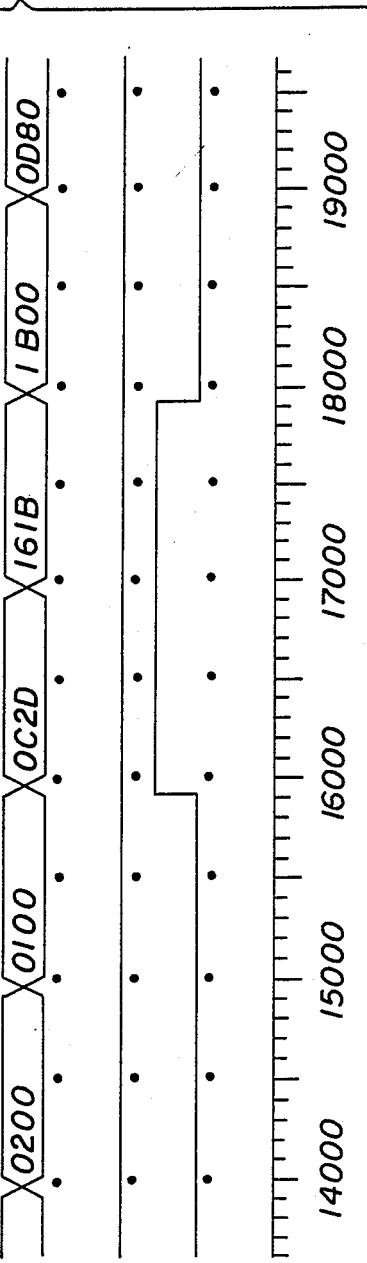
Figure 4H:
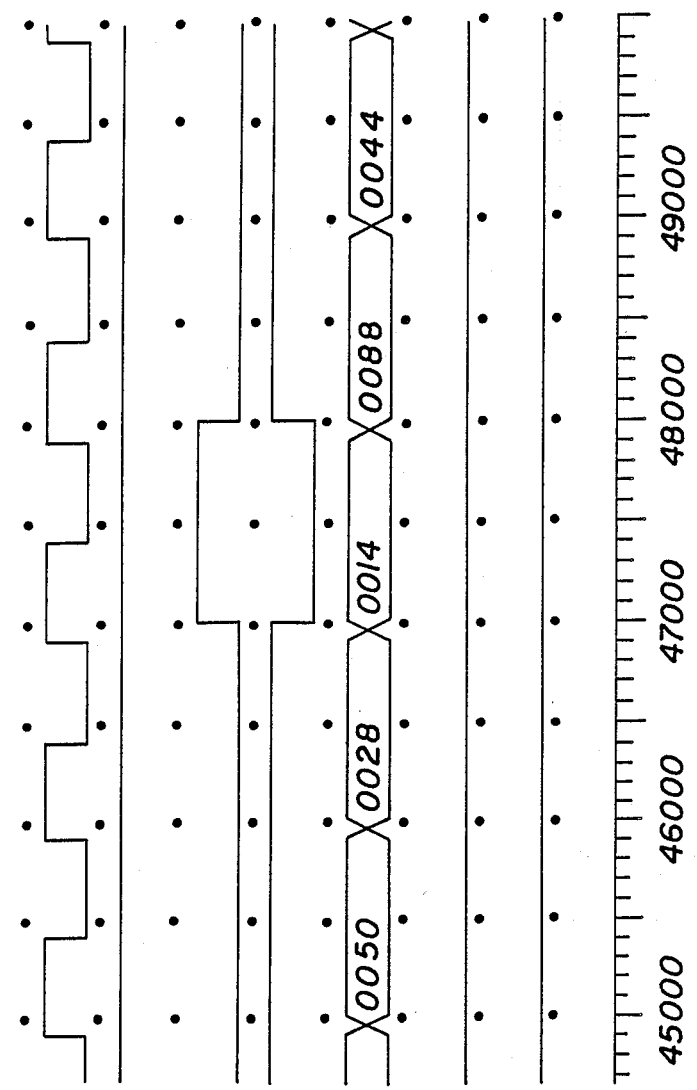

As will be recalled with reference to Table II, the normal shifting pattern is interrupted every sixteen clock cycles when the contents of the shift register $SR_{00}$ $SR_{14}$ must be reinitialized so as to jump ahead thirty-one states. When this occurs, the signal SHIFT_GENERATE on line 26 goes low and the signal JUMP_31 on line 28 goes high enabling AND gates 16. As in the case of the other gates 12 and 14, AND gate 16 also have subscripts identifying them with the subscript of the shift register SR stage which they control. The normal backward shifting process is interrupted when the signal SHIFT_GENERATE goes low and the signal JUMP_31 goes high, and the flip flops, instead of receiving data from a neighboring stage (or gate 11 in the case of flip flop $SR_{00}$), receive data from XOR gate logic 18 via AND gates 16 and OR gates 14. XOR gate logic implements the formulas set forth above for generating the new initialization values every sixteen clock cycles. A timing diagram for these signals and the other signals shown on FIG. 3 appears as FIG. 4 which is formed by joining FIGS. 4A to 4H. FIG. 4 also shows the contents of the shift register SR as the data propagates their on the leading edges of high going clock signal, called BIT_CLOCK herein.

The XOR gate logic 18 includes subscripts identifying the shift register SR stage which they control. For example, shift register stage $SR_{00}$ is controlled by XOR logic $18_{00}$ when the shift register jumps ahead thirty-one counts when the signal JUMP_31 goes high on line 28. XOR logic $18_{00}$ is, in turn, responsive to the contents of shift register cells $SR_{12}$ and $SR_{14}$ on lines R12 and R14, respectively. Similarly, shift register cell $SR_{01}$ is initialized during the jump-31 process by XOR logic $18_{01}$ which exclusively ORs the outputs of shift register cells $SR_{09}$, $SR_{12}$, $SR_{13}$ and $SR_{14}$ on lines R9, R12, R13 and R14, respectively. Shift register cells $SR_{02}$ and $SR_{03}$ are responsive during the jump-31 cycle to XOR gate logic $18_{02}$ and $18_{03}$, respectively, each of which logic exclusively OR the outputs of three flip flops, namely outputs R1, R13 and R14 in the case of XOR gate logic $18_{02}$ and outputs R2, R9 and R14 in the case of XOR gate logic $18_{03}$. The remaining XOR gate logics $18_{14}$ through $18_{04}$ are each responsive to the outputs of only two flip flops. Flip flop outputs R13 and R11 are XORed or shift register stage 14, outputs R12 and R10 are XORed for stage 13, outputs R11 and R9 are XORed for stage 12, outputs R10 and R8 are XORed for stage 11, outputs R9 and R7 are XORed for stage 10, outputs R8 and R6 are XORed for stage 9, outputs R7 and R5 are XORed for stage 8, outputs R6 and R4 are XORed for stage 7, outputs R5 and R3 are XORed for stage 6, outputs R4 and R2 are XORed for stage 5, and outputs R3 and R1 are XORed for stage 4.

Second Embodiment of the Invention

The present invention is not limited to the polynomial discussed above, which polynomial finds particular use in DAT applications. Consider, for example, an application where the block of the data to be randomized and derandomized is only 512 bytes (that is, 4096 bits) in length. In such applications, the following thirteenth degree irreducible generator polynomial, which has a period of 8191 bits, can be used:

$$g(x) = x^{13} + x^4 + x^3 + x + 1.$$

Figure 5:
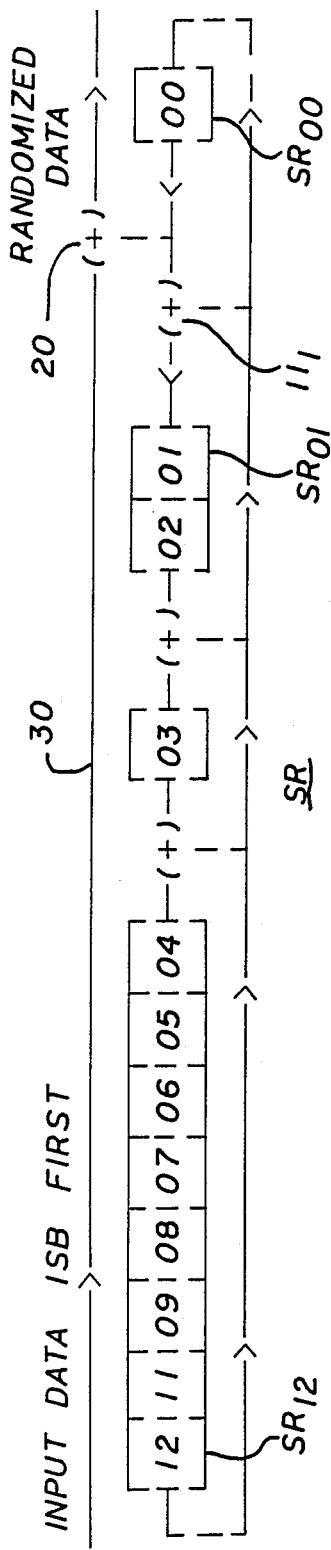
FIG. 5 is a diagram of a conventional shift register implementation for generating the field elements according to an irreducible generator polynomial of the type $g(x)=x^{13}+x^4+x^3+x+1$.

FIG. 5 shows a conventional shift register implementation for generating the field elements according to that polynomial. The single bit register cells are identified in the same manner as done in FIG. 1, except, of course, now there are only a total of thirteen cells $SR_{00}$ through $SR_{12}$. As in the case of FIG. 1, the shift register of FIG. 5 may be known as a forward randomizer.

The randomizer of FIG. 5 is initialized to 0 0000 0000 0001 at the beginning of each block of data and bit 0 of the randomizer is XORed with the incoming data stream at gate 20. This randomizer generates the data sequence shown in Table V.

Figure 6:
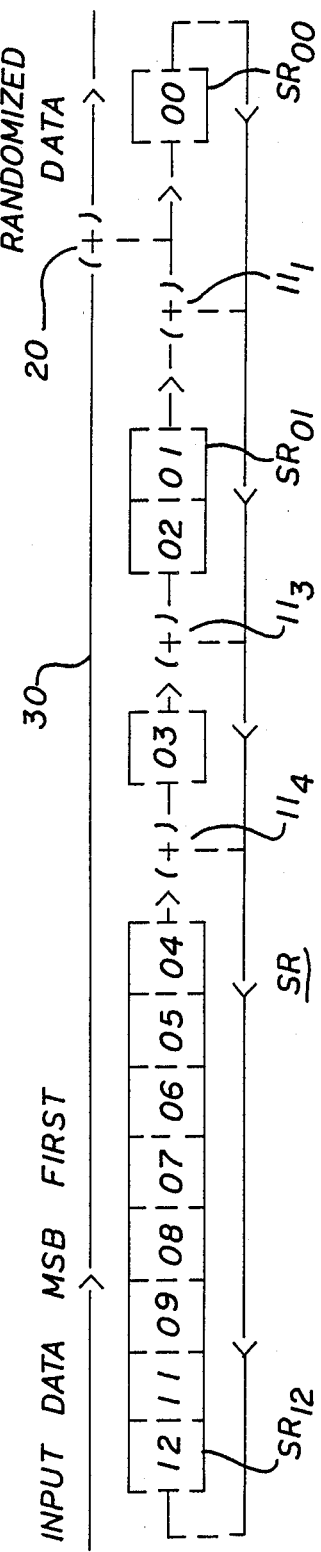
FIG. 6 is a diagram of a shift register similar to the shift register of FIG. 5, but arranged to count backwards compared to the shift register depicted in FIG. 5.
Figure 7A:
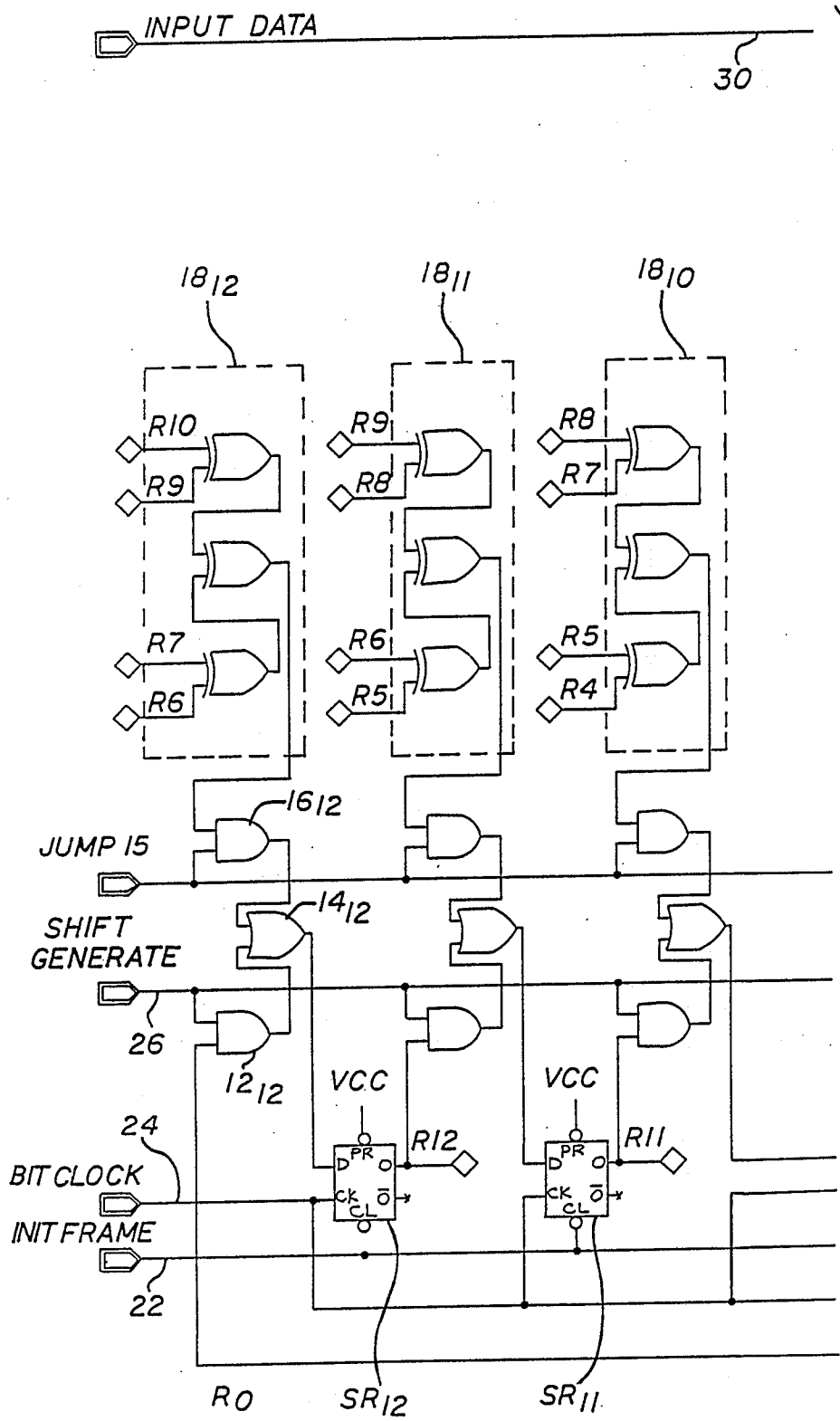
FIGS. 7A to 7E form a logic diagram of a backwards running shift register with exclusive OR logic producing a fifteen bit jump every eight clock cycles.
Figure 7B:
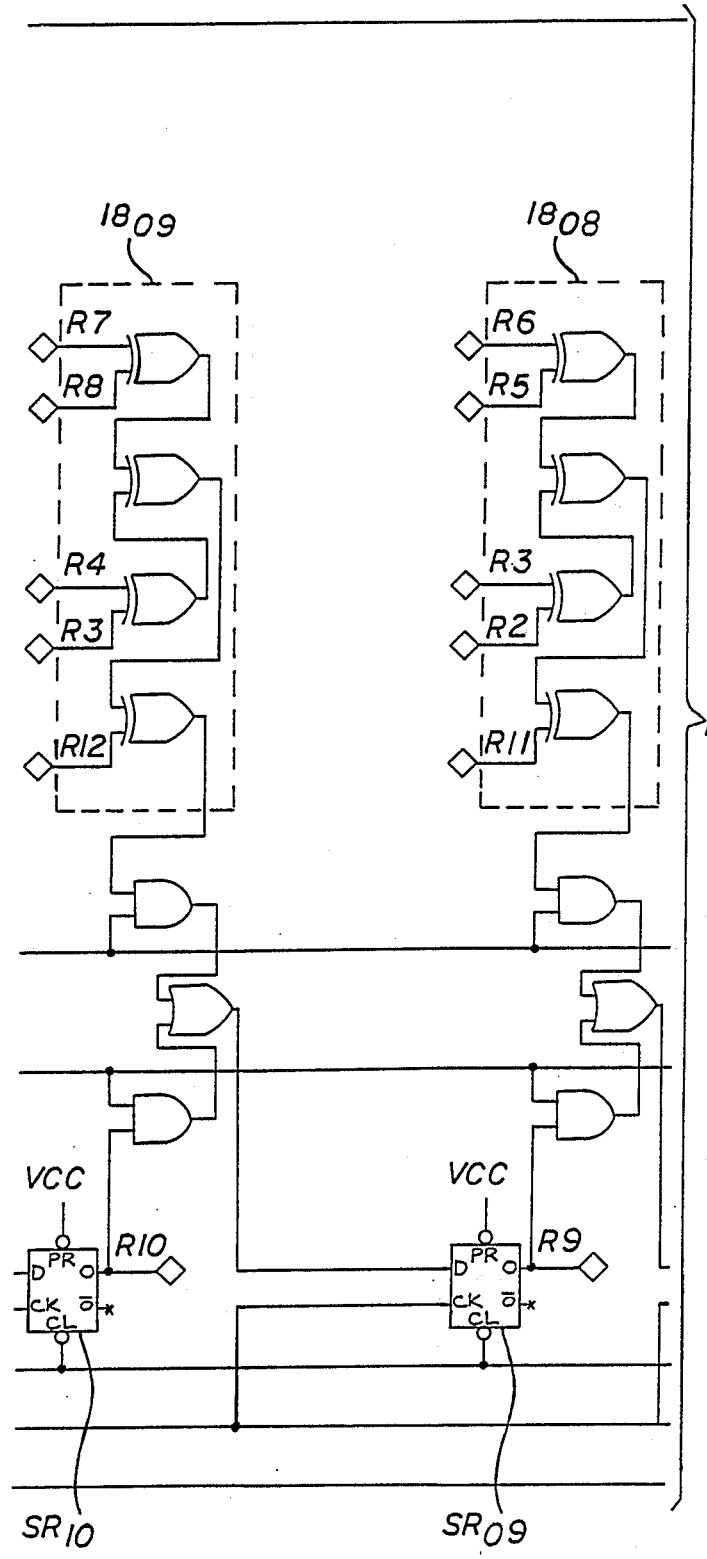
Figure 7C:
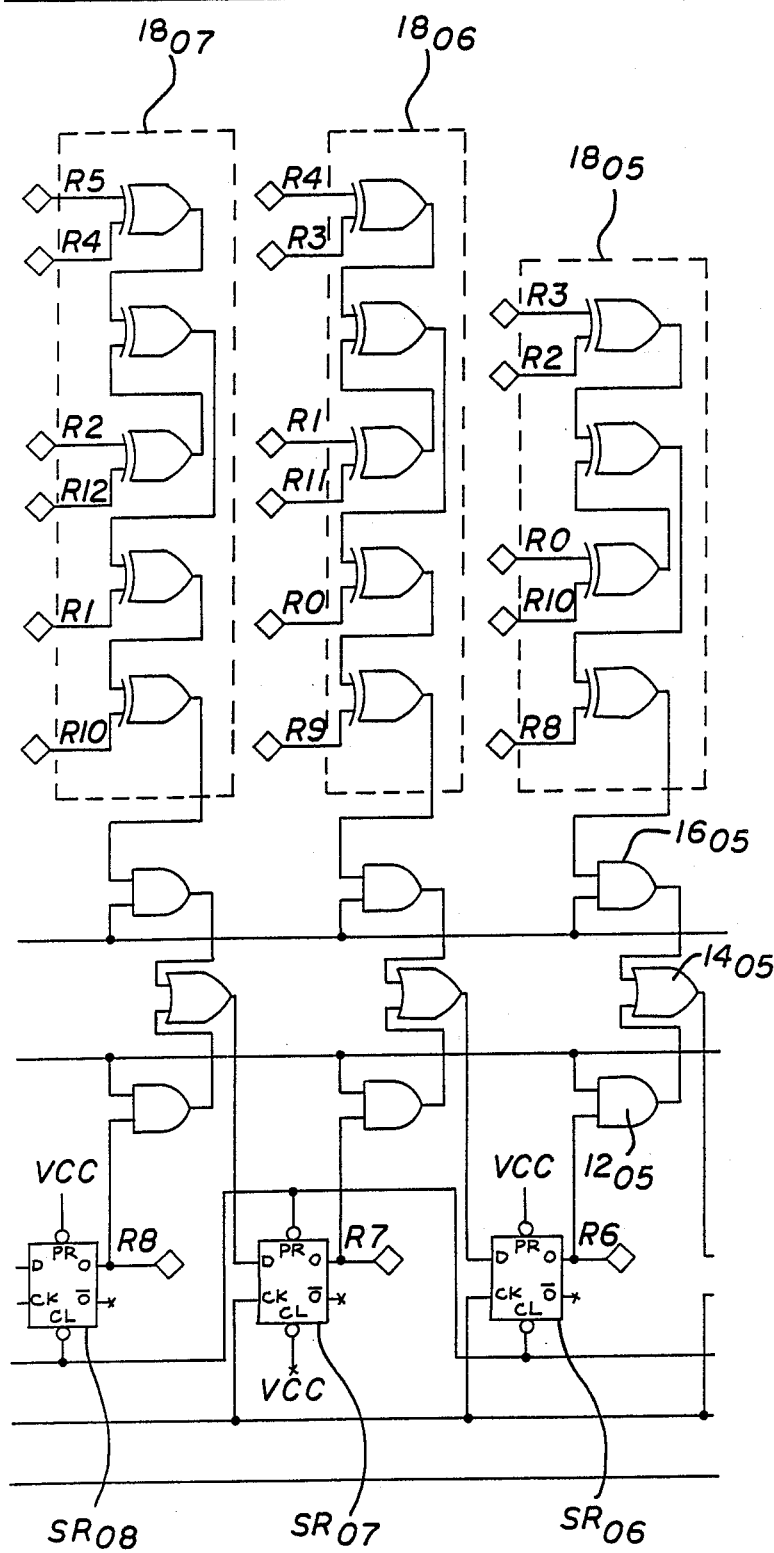
Figure 7D:
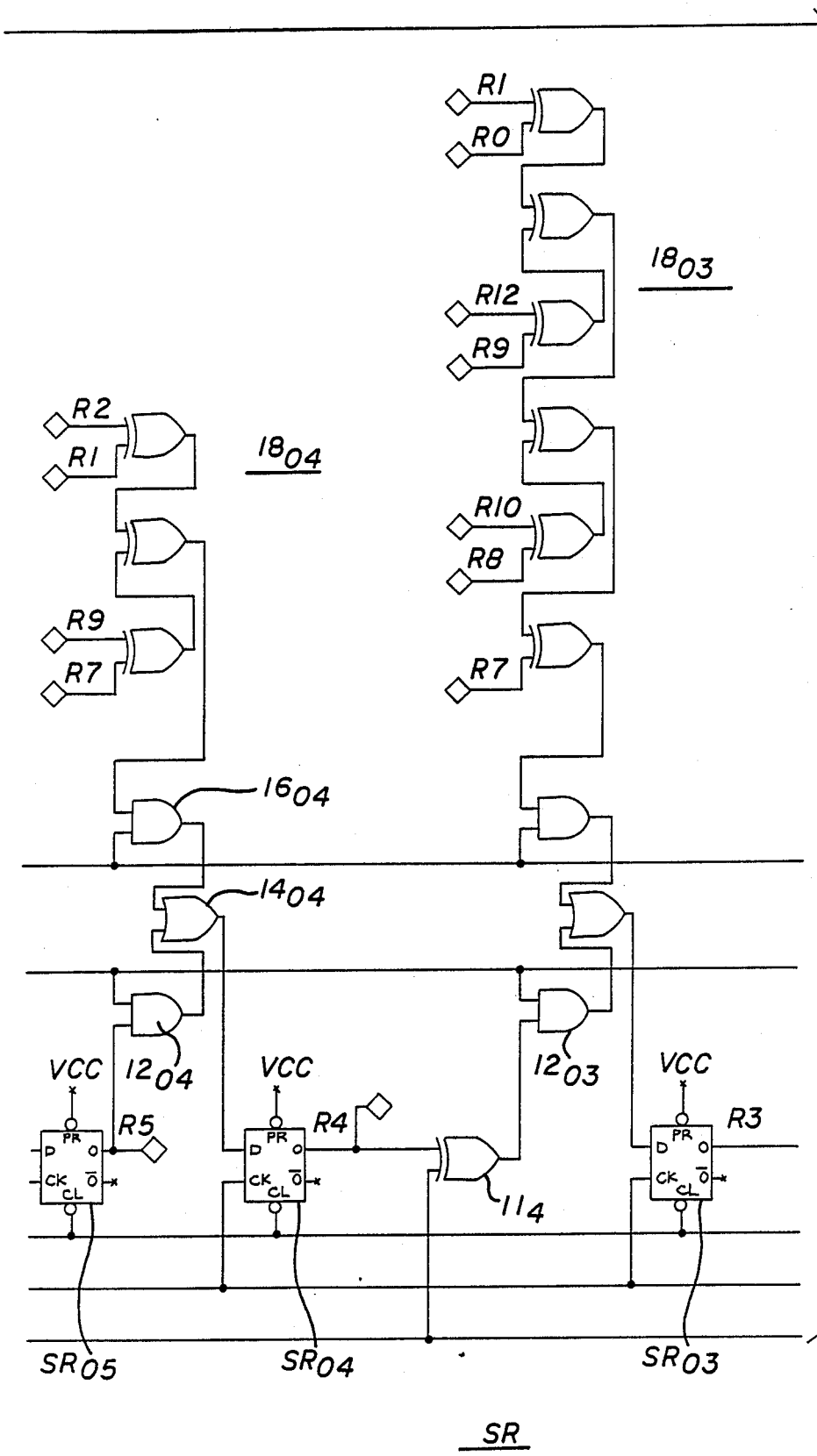
Figure 7E:
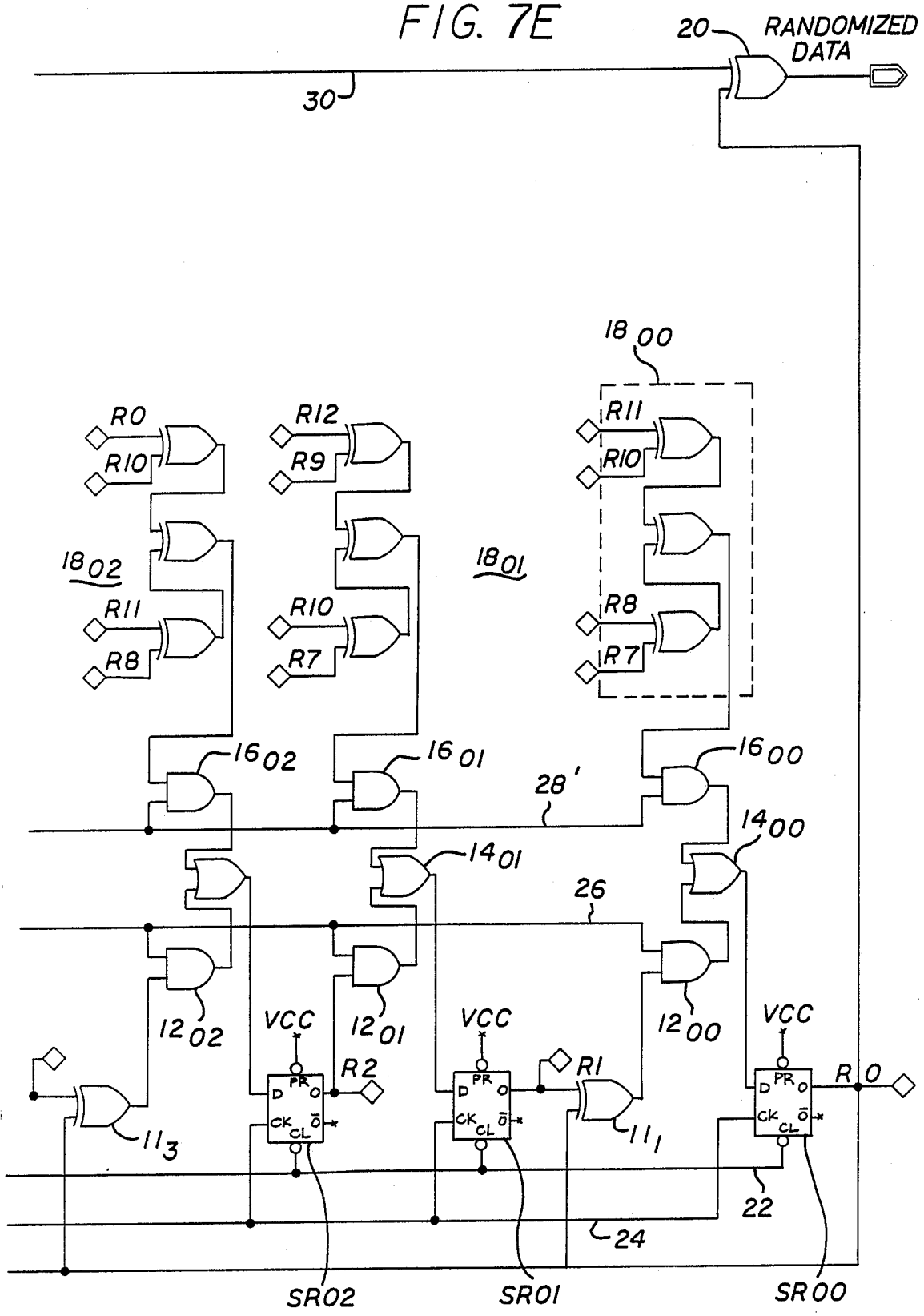

FIG. 6 depicts a backward randomizer which corresponds to the forward randomizer of FIG. 5; and Table VI shows the data which must be clocked through the backward randomizer in order for it to correctly randomize (or de-randomize) the data when the order of its significance changes. Assuming the initial bit of the incoming serial data on line 30 comes MSB first, the initial bit is, assuming eight bit bytes, bit 7 as opposed to bit 0 for LSB data. In order to correctly randomize (or de-randomize) the MSB data, at clock 0, the contents of the backward randomizer of FIG. 6 must be initialized to the same contents as the contents of the forward randomizer of FIG. 5 had for the seventh bit at clock 7 (see Table V). As can be seen by reference to Table V, when the forward randomizer sees bit 7 at clock 7, the contents of the shift register is 0 0000 1000 0000 (or $0080_{16}$ in hexadecimal). Thus, at clock 0, the backwards shift register of FIG. 6 must be initialized to the aforementioned value, namely $0080_{16}$. If the randomizer of FIG. 6 is then run backwards as shown in Table VI, then at clock 1, the hex value $0040_{16}$ will appear in the shift register SR for bit number 6 which is the correct value for encoding or decoding input bit number 6 as can be seen by reference to input bit number 6 at clock 6 for the forward randomizer of FIG. 5 and Table V.

As the backward randomizer randomizes (or de-randomizes), the input MSB first data from bit 7 through bit 0 during clock cycles 0 through 7, the data is correctly randomized (or de-randomized). However, at the very next clock cycle, namely, at clock 8, the contents of the backward randomizer must be set ahead so that it is then ready to decode input bit number 15. Since it just decoded input bit number 0 at clock 7, this is a jump of fifteen bits from the immediately preceding state of the backward randomizer. This means, in effect, that for each eight clock cycles, the contents of the backward randomizer must be reinitialized to a new value, which is in effect fifteen states ahead from its immediately preceding state, assuming, of course, that eight bit data is used. This is a set ahead of fifteen states from the state R(x) of the backward randomizer. This set ahead state, S(x), is given by the following formula:

$$S(x) = x^{15} R(x) \text{MOD} g(x)$$

which can be evaluated by long division as generally explained with reference to Tables III and IV (for the formula $S(x) = x^{31}$ R(x) MOD g(x)) and as is shown in Table VII (for the formula $S(x) = x^{15}$ R(x) MOD g(x)). The same nomenclature used with reference to Table III is also used in Table VII and in the following equations for the 15 bit set ahead, which are evaluated from Table VII as follows:

$c = A + 9 + 7 + 6$ $b = 9 + 8 + 6 + 5$ $a = 8 + 7 + 5 + 4$ $9 = 7 + 6 + 4 + 3 + C$ $8 = 6 + 5 + 3 + C + 2 + C + B = 6 + 5 + 3 + 2 + B$ (after simplification)

$7 = 5 + 4 + 2 + C + B + O + B + A = 5 + 4 + 2 + C + O + A$ (after simplification)

$6 = 4 + 3 + C + O + B + A + Z + C + A + 9 = 4 + 3 + O + B + Z + 9$ (after simplification)

$5 = 3 + C + 2 + C + B + Z + C + A + 9 + C + B + 9 + 8 = 3 + 2 + Z + A + 8$ (after simplification)

$4 = 2 + C + B + O + B + A + C + B + 9 + 8 + B + A + 8 + 7 = 2 + O + 9 + 7$ (after simplification)

$3 = O + B + A + Z + C + A + 9 + B + A + 8 + 7 = O + Z + C + 9 + A + 8 + 7$ (after simplification)

$2 = Z + C + A + 9 + C + B + 9 + 8 = Z + A + B + 8$ (after simplification)

$o = C + B + 9 + 8 + B + A + 8 + 7 = C + 9 + A + 7$ (after simplification)

$z = B + A + 8 + 7$ where + is taken to indicate an exclusive OR operation, the term to the left of the equals sign indicates the set ahead values and terms to the right of equals indicate the old backward generator values.

The elements for the foregoing equations can be found in Table VII as follows. At the bottom of the table are set forth the coefficients "c" through "z" of S(x). For each coefficient, consider the column of terms immediately above it, ignoring the zeros (0) and furthermore any terms which appear twice should also be ignored since exclusive ORing with the same term has no effect. Thus for the coefficient "c" the terms A976 are found in the column immediately above that term, reading downward. For the coefficient "5", the terms 3C2CBZCA9CB98 are found, resulting in the simplified equation $5=3+2+Z+A+8$, since, as previously discussed, terms which appear twice are ignored. The other coefficients are found in the same manner.

FIGS. 7A to 7E form a logic diagram, which is now referred to as FIG. 7. This logic diagram shows a shift register SR with XOR logic which implements the foregoing solutions to the equation $S(x)=x^{15} R(x)$ MOD $g(x)$. Here the signals on lines R12 through R0 replace the signals c through z in the solutions to the equation and the backward randomizer is set up to generate a thirteen degree polynomial, but according to the pattern shown in Table VI. The individual flip flops which make up the shift register, are identified as flip flops $SR_{00}$ through flip flop $SR_{12}$. At the beginning of a block of data, the shift register is initialized by a signal, INIT_FRAME, on line 22 to force the shift register $SR_{00}SR_{12}$ to initialize to the value $0080_{16}$. Thereafter, the contents of the shift register is shifted by a clock applied to line 24. The contents of the "Q" output of each flip flop stage is communicated to its neighboring stage via a pair of gates 12 and 14. In the case of flip flops $SR_{01}$, $SR_{03}$ and $SR_{04}$, their outputs R1, R3 and R4 are each exclusively ORed at respective XOR gates $11_1$, $11_3$, and $11_4$ with the "Q" output RO from flip flop $SR_{00}$. The outputs of XOR gates $11_1$, $11_3$, and $11_4$ are each applied via a respective AND gate $12_{00}$, $12_{02}$ and $12_{03}$ and OR gate $14_{00}$, $14_{02}$ and $14_{03}$ to the "D" input of flip flops $SR_{00}$, $SR_{02}$ and $SR_{03}$. Gates $12_{12}$ through $12_{00}$ (collectively referred to as AND gates 12) are enabled by a signal on line 26 which goes high to turn on AND gates 12 and permit the backward shifting pattern to occur through the shift register SR. The output from each AND gate $12_{12}$ through $12_{00}$ is applied to an associated OR gate $14_{12}$ through $14_{00}$ (collectively referred to as OR gates 14) to the "D" input of their associated flip flop. Gates 12 and 14 are identified in FIG. 3 with a subscript identical to the subscript of the shift register SR cell or stage which they control.

The output of flip flop $SR_{00}$ is exclusively ORed with the incoming serial data stream on line 30 by XOR gate 20. The output of flip flop $SR_{00}$ is also applied to the input of flip flop $SR_{12}$ via AND gate $12_{12}$ and OR gate $14_{12}$. The output of flip flop $SR_{12}$ is applied to the input of its neighboring, lower order flip flop $SR_{12}$ via AND gate $12_{11}$ and OR gate $14_{11}$ and the remaining flip flops are similarly connected, except as noted above with respect to XOR gates $11_1$, $11_3$ and $11_4$.

Figure 8D:
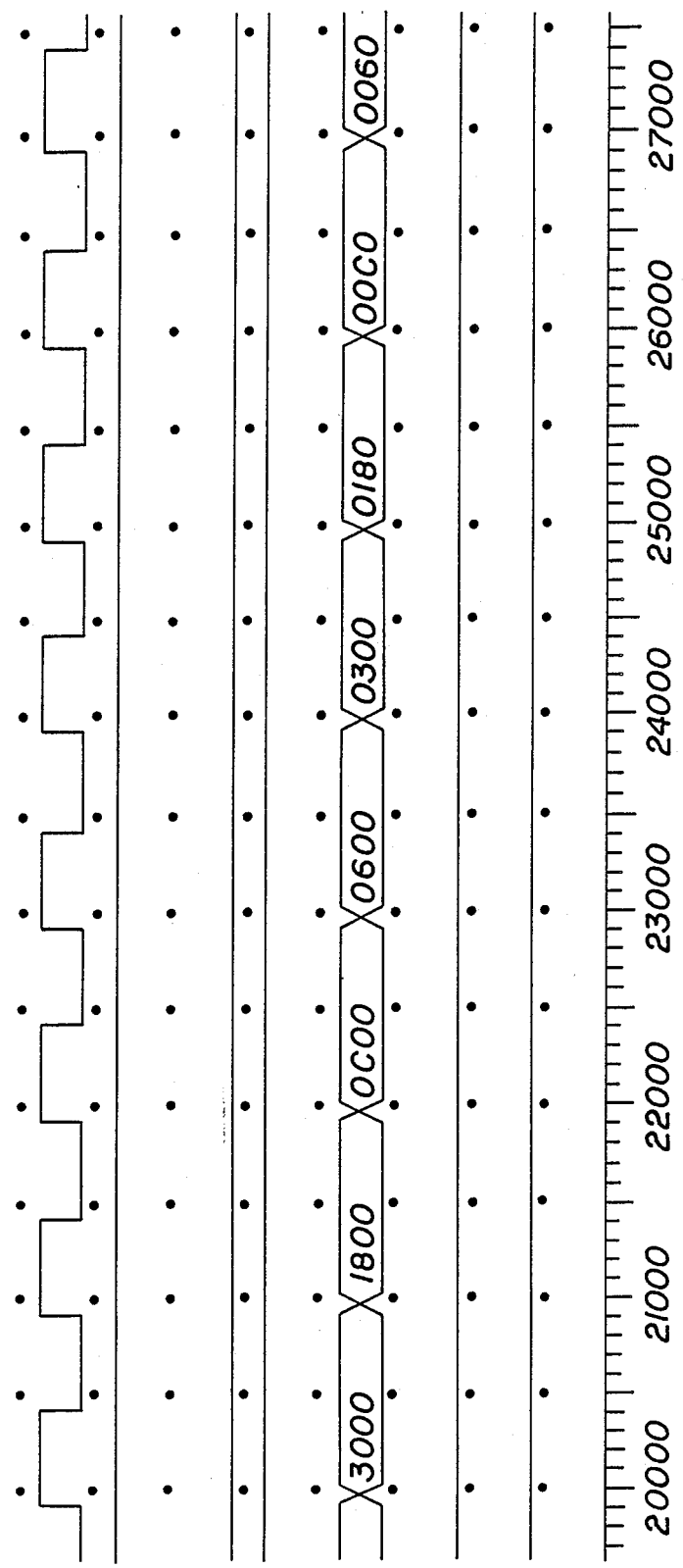
FIGS. 8A to 8B are a timing diagram for the logic diagram of FIGS. 7A–7E.

As will be recalled with reference to Table VI, the normal shifting pattern is interrupted every eight clock cycles when the contents of the shift register $SR_{00}$ $SR_{12}$ must be reinitialized so as to jump ahead fifteen states. When this occurs, the signal SHIFT_GENERATE on line 26 goes low and the signal JUMP_15 on line 28' goes high enabling AND gates 16. As in the case of the other gates 12 and 14, AND gate 16 also have subscripts identifying them with the subscript of the shift register SR stage which they control. The normal backward shifting process is interrupted when the signal SHIFT_GENERATE goes low and the signal JUMP_15 goes high, and the flip flops, instead of receiving data from a neighboring stage (and exclusively ORed with the contents of gates $11_1$, $11_3$ and $11_4$ in the case of flip flops $SR_{00}$, $SR_{02}$ and $SR_{03}$), receive data from XOR gate logic 18 via AND gates 16 and OR gates 14. XOR gate logic implements the equations for the 15 bit set ahead set forth above for generating the new initialization values every eight clock cycles. A timing diagram for these signals and the other signals shown on FIG. 7 appears as FIGS. 8A to 8D, now referred to as FIG. 8, which also shows the contents of the shift register SR as the data propagates their on the leading edges of high going clock signal, called BIT_CLOCK herein.

The XOR gate logic 18 includes subscripts identifying the shift register SR stage which they control. For example, shift register stage $SR_{00}$ is controlled by XOR logic $18_{00}$ when the shift register jumps ahead fifteen counts when the signal JUMP_15 goes high on line 28. The specific pattern of exclusive OR gates which may be used to implement the equations can be seen in FIG. 7 and follow from the equations for the 15 bit set ahead noted above.

Third Embodiment of the Invention

Those skilled in the art will appreciate that the backward randomizers of the type shown and described with reference to FIGS. 3 and 7 can be implemented as an integrated circuit, if so desired, or can be implemented using standard TTL devices. When so implemented, I prefer to use Programmed Logic Arrays (PLA's) to carry out the logical operations described above with reference to XOR gate logic 18, since using PLA's can reduce the number of devices required.

The First and Second Embodiments are very useful with reference to understanding the invention because I believe the invention is better understood by reference to those embodiments, but this Third Embodiment is the preferred embodiment, since it minimizes the number of devices utilized and thereby reduced fabrication costs compared to the First and Second Embodiments. This Third Embodiment is the logical equivalent of the First Embodiment, this is, it finds particular usefulness in connection with data randomization and/or derandomization schemes used with DAT devices to store digital data. Different signal names are used in this Third Embodiment and the correspondence between the signals of the First and Third Embodiments is set forth in Table VIII.

Figure 9B:
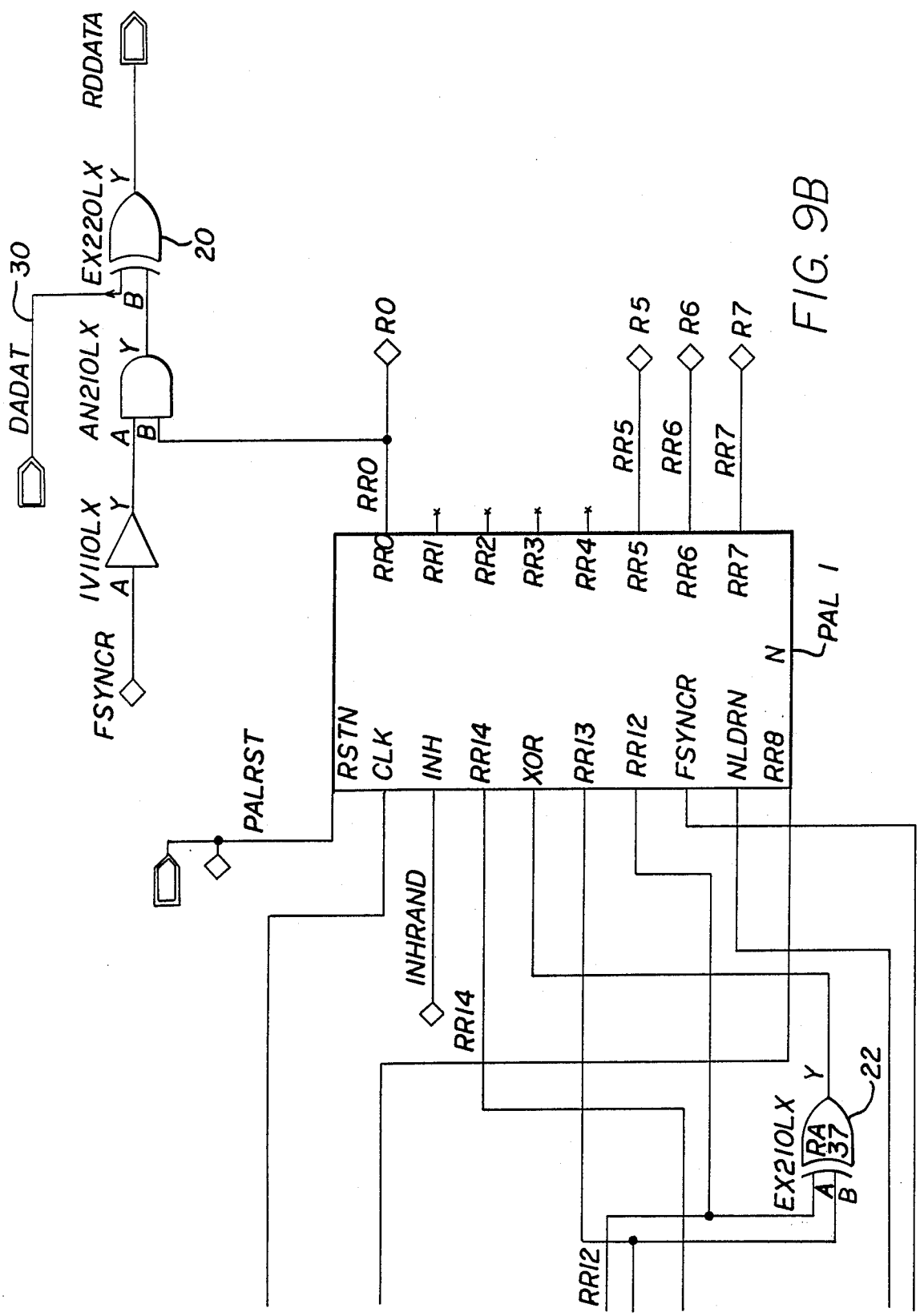

FIGS. 9A to 9B, henceforth referred to as FIG. 9 is a logic diagram of this Third Embodiment. An inhibit function, which is generated by the signal INH, is provided to make it easier to test the resulting circuit or chip, if integrated, whereby the randomizing function can be inhibited when desired. Shift register outputs R0 through R7 are implemented by PAL1 while shift register outputs R8 through R14 are implemented by PAL2. Both of these Programmed Logic Devices can be provided by PAL16R8 devices sold by Monolithic Memories under their brand PALASM2 or their logical equivalent or their LSI equivalent, if the randomizer is integrated on a chip performing other functions, for example. The logic equation descriptions of PAL1 and PAL2 are shown in Table IX. A reverse slash before a signal name indicates that it is a negative logic signal, that is, the inverse of its positive logic kin with which it shares an otherwise common name.

The PAL implementation requires that the equation description for the devices be reduced to canonical form, i.e., with "and" and "or" functions. Computer programs are available to perform such reductions for the PAL16R8 chips. Table X shows the results of reducing the equations of Table VIII in terms of the signal names which are identified used on FIG. 8 and in Table IX. Table XI shows the same results as does Table X, but in terms of the pin numbers on the PAL's. The relationship between the signals names and the pin numbers of the PAL's on which they appear is set forth in Table XII. Those skilled in the art will know how to "program" PAL1 and PAL2 based on the foregoing and will appreciate that the two PAL's do not have quite enough capacity to handle all of the required terms, but that capacity is close enough so that only one additional XOR gate 22 is required in this embodiment. The R0 output of PAL1 is exclusively ORed with the incoming data stream DADAT on line 30 at XOR gate 20 to perform the data randomizing or de-randomizing function previously described with reference to FIG. 3 and Table II.

Further Modification of the Disclosed Embodiments

Having described the invention in connection with certain embodiments, modifications should now suggest itself to those skilled in the art. For example, the First and Third Embodiments relate to sixteen bit words and a particular polynomial and the second Embodiment relates to eight bit words and a different polynomial. It should now be apparent to those skilled in the art that the present invention is not limited to either sixteen or eight bit words or to any particular polynomial. If different length words are used or if a different polynomial is used, then the XOR logic described above will require modification to correspond to solutions (as done with respect to the First and Third Embodiments in Table III or the Second Embodiment in Table VII) of the equation:

$$S(x) = x^{2N-1} R(x) \mathrm{MOD} g(x)$$

where N equals the number of bits in a word of data. Of course, in that case the length of the jump corresponds to $2N-1$ states and the jump occurs every N states.

It should now be apparent that the present invention can be embodied in many different forms that therefore the present invention is not to be limited to the disclosed embodiments except as specifically required by the appended claims.

What is claimed is:

| input bit # | clock | binary data | hex data |
|---|---|---|---|
| 0 | 0 | 000 0000 0000 0001 | 0001 |
| 1 | 1 | 000 0000 0000 0010 | 0002 |
| 2 | 2 | 000 0000 0000 0100 | 0004 |
| 3 | 3 | 000 0000 0000 1000 | 0008 |
| 4 | 4 | 000 0000 0001 0000 | 0010 |
| 5 | 5 | 000 0000 0010 0000 | 0020 |
| 6 | 6 | 000 0000 0100 0000 | 0040 |
| 7 | 7 | 000 0000 1000 0000 | 0080 |
| 8 | 8 | 000 0001 0000 0000 | 0100 |
| 9 | 9 | 000 0010 0000 0000 | 0200 |
| 10 | 10 | 000 0100 0000 0000 | 0400 |
| 11 | 11 | 000 1000 0000 0000 | 0800 |
| 12 | 12 | 001 0000 0000 0000 | 1000 |
| 13 | 13 | 010 0000 0000 0000 | 2000 |
| 14 | 14 | 100 0000 0000 0000 | 4000 |
| 15 | 15 | 000 0000 0000 0011 | 0003 |
| 16 | 16 | 000 0000 0000 0110 | 0006 |
| 17 | 17 | 000 0000 0000 1100 | 000C |
| 18 | 18 | 000 0000 0001 1000 | 0018 |
| 19 | 19 | 000 0000 0011 0000 | 0030 |
| 20 | 20 | 000 0000 0110 0000 | 0060 |
| 21 | 21 | 000 0000 1100 0000 | 00C0 |
| 22 | 22 | 000 0001 1000 0000 | 0180 |
| 23 | 23 | 000 0011 0000 0000 | 0300 |

TABLE I

| input bit# | clock | binary data | hex data |
|---|---|---|---|
| 15 | 0 | 000 0000 0000 0011 | 0003 |
| 14 | 1 | 100 0000 0000 0000 | 4000 |
| 13 | 2 | 010 0000 0000 0000 | 2000 |
| 12 | 3 | 001 0000 0000 0000 | 1000 |
| 11 | 4 | 000 1000 0000 0000 | 0800 |
| 10 | 5 | 000 0100 0000 0000 | 0400 |
| 9 | 6 | 000 0010 0000 0000 | 0200 |
| 8 | 7 | 000 0001 0000 0000 | 0100 |
| 7 | 8 | 000 0000 1000 0000 | 0080 |
| 6 | 9 | 000 0000 0100 0000 | 0040 |
| 5 | 10 | 000 0000 0010 0000 | 0020 |
| 4 | 11 | 000 0000 0001 0000 | 0010 |
| 3 | 12 | 000 0000 0000 1000 | 0008 |
| 2 | 13 | 000 0000 0000 0100 | 0004 |
| 1 | 14 | 000 0000 0000 0010 | 0002 |
| 0 | 15 | 000 0000 0000 0001 | 0001 |
| 31 | 16 | 000 0000 0000 0110 | 000A |
| 30 | 17 | 000 0000 0000 0101 | 0005 |
| 29 | 18 | 100 0000 0000 0011 | 4003 |
| 28 | 19 | 110 0000 0000 0000 | 6000 |
| 27 | 20 | 011 0000 0000 0000 | 3000 |
| 26 | 21 | 001 1000 0000 0000 | 1800 |
| 25 | 22 | 000 1100 0000 0000 | 0C00 |
| 24 | 23 | 000 0110 0000 0000 | 0600 |
| 23 | 24 | 000 0011 0000 0000 | 0300 |
| 22 | 25 | 000 0001 1000 0000 | 0180 |
| 21 | 26 | 000 0000 1100 0000 | 00C0 |
| 20 | 27 | 000 0000 0110 0000 | 0060 |
| 19 | 28 | 000 0000 0011 0000 | 0030 |
| 18 | 29 | 000 0000 0001 1000 | 0018 |
| 17 | 30 | 000 0000 0000 1100 | 000C |
| 16 | 31 | 000 0000 0000 0110 | 000A |

TABLE II

```
                                                            O
                                             ZE DCB A987 6543 2ZZE
                          EDCB A987 6543 20ED CBA 9876 5432 0EDC
1000 0000 0000 0011|EDC BA98 7654 320Z 0000 0000 0000 0000.000 0000 0000 0000
                   |E00 0000 0000 000E E                  .
                   | D0 0000 0000 0000 DD                 .
                   |  C 0000 0000 0000 0CC                .
                   |    B000 0000 0000 00BB               .
                   |     A00 0000 0000 000A A             .
                   |      90 0000 0000 0000 99            .
                   |       8 0000 0000 0000 088           .
                   |         7000 0000 0000 0077          .
                   |          600 0000 0000 0006 6        .
                   |           50 0000 0000 0000 55       .
                   |            4 0000 0000 0000 044      .
                   |              3000 0000 0000 0033     .
                   |               200 0000 0000 0002 2   .
                   |                00 0000 0000 0000 00  .
                   |                 Z 0000 0000 0000 0ZZ .
                   |                   E 0000 0000 0000 0EE .
                   |                    E000 0000 0000 00EE.
                   |                     D000 0000 0000 00DD.
                   |                      D00 0000 0000 000D.D
```

```
|                                             C00 0000 0000 000C.C
|                                              C0 0000 0000 0000.CC
|                                              B0 0000 0000 0000.BB
|                                               B 0000 0000 0000.0BB
|                                               A 0000 0000 0000.0AA
|                                              A000 0000 0000.00A A
|                                              9000 0000 0000.009 9
|                                               900 0000 0000.000 99
|                                               800 0000 0000.000 88
|                                                80 0000 0000.000 088
|                                                70 0000 0000.000 077
|                                                 7 0000 0000.000 0077
|                                                 6 0000 0000.000 0066
|                                               6000 0000.000 0006 6
|                                               5000 0000.000 0005 5
|                                                500 0000.000 0000 55
|                                                400 0000.000 0000 44
|                                                 40 0000.000 0000 044
|                                                 30 0000.000 0000 033
|                                                  3 0000.000 0000 0033
|                                                  2 0000.000 0000 0022
|                                                2000.000 0000 0002 2
|                                                0000.000 0000 0000 0
|                                                 000.000 0000 0000 00
|                                                 Z00.000 0000 0000 ZZ
|                                                 E00.000 0000 0000 EE
|                                                  Z0.000 0000 0000 0ZZ
|                                                  D0.000 0000 0000 0DD
|                                                   E.000 0000 0000 00EE
|                                                   C.000 0000 0000 00CC
|000 0000 0000 0000 0000 0000 0000 0000.edc ba98 7654 32oz
                                         coefficients of S(x)
```

TABLE III

LONG DIVISION EXAMPLE

STEP 1

```
                                                    E
1000 0000 0000 0011  |  EDC BA98 7654 320Z 0
                        E00 0000 0000 000E E
                        DC BA98 7654 320Z E
                    +                     E
```

STEP 2

```
                                                    D
1000 0000 0000 0011  |  0DC BA98 7654 320Z E0
                                           E
                        D0 0000 0000 0000 DD
                         C BA98 7654 320Z EDD
                    +                     E
```

TABLE IV

SIGNAL NAME RELATIONSHIP

| First Embodiment | Third Embodiment |
|---|---|
| BIT-CLOCK | CLK |

| INIT_FRAME | FSYNC |
|---|---|
| JUMP_31 | /FSYNC |
| SHIFT_GENERATE | /NLDRN or /NLD |
| R0 through R15 | R0 through R15 |

TABLE VIII

The randomizer generates the following sequence:

| input bit # | clock | binary data | hex data |
|---|---|---|---|
| 0 | 0 | 0 0000 0000 0001 | 0001 |
| 1 | 1 | 0 0000 0000 0010 | 0002 |
| 2 | 2 | 0 0000 0000 0100 | 0004 |
| 3 | 3 | 0 0000 0000 1000 | 0008 |
| 4 | 4 | 0 0000 0001 0000 | 0010 |
| 5 | 5 | 0 0000 0010 0000 | 0020 |
| 6 | 6 | 0 0000 0100 0000 | 0040 |
| 7 | 7 | 0 0000 1000 0000 | 0080 |
| 8 | 8 | 0 0001 0000 0000 | 0100 |
| 9 | 9 | 0 0010 0000 0000 | 0200 |
| 10 | 10 | 0 0100 0000 0000 | 0400 |
| 11 | 11 | 0 1000 0000 0000 | 0800 |
| 12 | 12 | 1 0000 0000 0000 | 1000 |
| 13 | 13 | 0 0000 0001 1011 | 001B |
| 14 | 14 | 0 0000 0011 0110 | 0036 |
| 15 | 15 | 0 0000 0110 1100 | 006C |
| 16 | 16 | 0 0000 1101 1000 | 00D8 |
| 17 | 17 | 0 0001 1011 0000 | 01B0 |
| 18 | 18 | 0 0011 0110 0000 | 0360 |
| 19 | 19 | 0 0110 1100 0000 | 06C0 |
| 20 | 20 | 0 1101 1000 0000 | 0D80 |
| 21 | 21 | 1 1011 0000 0000 | 1B00 |
| 22 | 22 | 1 0110 0001 1011 | 161B |
| 23 | 23 | 0 1100 0010 1101 | 0C2D |

TABLE V

| input bit# | clock | binary data | hex data |
|---|---|---|---|
| 7 | 0 | 0 0000 1000 0000 | 0080 |
| 6 | 1 | 0 0000 0100 0000 | 0040 |
| 5 | 2 | 0 0000 0010 0000 | 0020 |
| 4 | 3 | 0 0000 0001 0000 | 0010 |
| 3 | 4 | 0 0000 0000 1000 | 0008 |
| 2 | 5 | 0 0000 0000 0100 | 0004 |
| 1 | 6 | 0 0000 0000 0010 | 0002 |
| 0 | 7 | 0 0000 0000 0001 | 0001 |
| 15 | 8 | 0 0000 0110 1100 | 006C |
| 14 | 9 | 0 0000 0011 0110 | 0036 |
| 13 | 10 | 0 0000 0001 1011 | 001B |
| 12 | 11 | 1 0000 0000 0000 | 1000 |
| 11 | 12 | 0 1000 0000 0000 | 0800 |

|    |    |            |      |
|----|----|------------|------|
| 10 | 13 | 0 0100 0000 0000 | 0400 |
|  9 | 14 | 0 0010 0000 0000 | 0200 |
|  8 | 15 | 0 0001 0000 0000 | 0100 |
|    |    |            |      |
| 23 | 16 | 0 1100 0010 1101 | 0C2D |
| 22 | 17 | 1 0110 0001 1011 | 161B |
| 21 | 18 | 1 1011 0000 0000 | 1B00 |
| 20 | 19 | 0 1101 1000 0000 | 0D80 |
| 19 | 20 | 0 0110 1100 0000 | 06C0 |
| 18 | 21 | 0 0011 0110 0000 | 0360 |
| 17 | 22 | 0 0001 1011 0000 | 01B0 |
| 16 | 23 | 0 0000 1101 1000 | 00D8 |

TABLE VI

```
                                              7
                                             88
                                             99
                                            AA A
                                           B B BB
                                           CC  CC
                          CB A 9876 5432 0Z
10 0000 0001 1011|CBA 9876 5432 0Z00.0 0000 0000 0000
                 |C00 0000 00CC 0CC .
                 | B0 0000 000B B0BB
                 |  A 0000 0000 AA0A A
                 |    9000 0000 0990 9  9
                 |     800 0000 0088 0 88
                 |      70 0000 0007 7 077
                 |       6 0000 0000 6 6066
                 |        5000 0000 0 5505 5
                 |         400 0000 0 0440 44
                 |          30 0000 0 0033 033
                 |          C0 0000 0 00CC 0CC
                 |           2 0000 0 0002 2022
                 |           C 0000 0 000C C0CC
                 |           B 0000 0 000B B0BB
                 |             0000 0 0000 0000 0
                 |             B000 0 0000 BB0B B
                 |             A000 0 0000 AA0A A
                 |              Z00 0 0000 0ZZ0 ZZ
                 |              C00 0 0000 0CC0 CC
                 |              A00 0 0000 0AA0 AA
                 |              900 0 0000 0990 99
                 |               C0 0 0000 00CC 0CC
                 |               B0 0 0000 00BB 0BB
                 |               90 0 0000 0099 099
                 |               80 0 0000 0088 088
                 |                B 0 0000 000B B0BB
                 |                A 0 0000 000A A0AA
                 |                8 0 0000 0008 8088
                 |                7 0 0000 0007 7077
                 |000 0000 0000 0000.c ba98 7654 320z
                                  coefficients of S(x)
```

TABLE VII

```
EQUATIONS FOR PAL1
;XOR = R12*/R13+/R12*R13
/R0 := /(/INH*FSYNC+/INH*/FSYNC*/NLD*(R1*/R0+/R1*R0)
                +/INH*/FSYNC*NLD*(R14*/R12+/R14*R12))
/R1 := /(FSYNC+/FSYNC*/NLD*R2+/FSYNC*NLD*(R0*/R14*/XOR+/R0*R14*/XOR
                                +/R0*/R14*XOR+R0*R14*XOR))
/R2 := /(/FSYNC*(/NLD*R3+NLD*(R1*/R14*/R13+/R1*R14*/R13
                                +/R1*/R14*R13+R1*R14*R13)))
/R3 := /(/FSYNC*(/NLD*R4+NLD*(R2*/R0*/R14+/R2*R0*/R14
                                +/R2*/R0*R14+R2*R0*R14)))
/R4 := /(/FSYNC*(/NLD*R5+NLD*(R3*/R1+/R3*R1)))
/R5 := /(/FSYNC*(/NLD*R6+NLD*(R4*/R2+/R4*R2)))
/R6 := /(/FSYNC*(/NLD*R7+NLD*(R5*/R3+/R5*R3)))
/R7 := /(/FSYNC*(/NLD*R8+NLD*(R6*/R4+/R6*R4)))

EQUATIONS FOR PAL2
/R8  := /(/FSYNC*(/NLD*R9+NLD*(R7*/R5+/R7*R5)))
/R9  := /(/FSYNC*(/NLD*R10+NLD*(R8*/R6+/R8*R6)))
/R10 := /(/FSYNC*(/NLD*R11+NLD*(R9*/R7+/R9*R7)))
/R11 := /(/FSYNC*(/NLD*R12+NLD*(R10*/R8+/R10*R8)))
/R12 := /(/FSYNC*(/NLD*R13+NLD*(R11*/R9+/R11*R9)))
/R13 := /(/FSYNC*(/NLD*R14+NLD*(R12*/R10+/R12*R10)))
/R14 := /(/FSYNC*(/NLD*R0+NLD*(R13*/R11+/R13*R11)))
```

TABLE IX

```
TITLE FILE RAND    ..JED DIS-ASSEMBLED
DATE 10-26-89

CHIP DIS_ASM PAL16R8

CLK INH R14 XOR R13 R12 FSYNC /NLD R8 GND
OE R0 R1 R2 R3 R4 R5 R6 R7 VCC

EQUATIONS

/R7:=    /NLD *  /R8
      +   R6 *   R4 * NLD
      +  /R6 *  /R4 * NLD
      +   FSYNC

/R6:=   /R7 *    /NLD
      +   R5 *   R3 * NLD
      +  /R5 *  /R3 * NLD
      +   FSYNC

/R5:=   /R6 *    /NLD
      +   R4 *   R2 * NLD
      +  /R4 *  /R2 * NLD
      +   FSYNC

/R4:=   /R5 *    /NLD
      +   R3 * NLD *   R1
      +  /R3 * NLD *  /R1
      +   FSYNC

/R14:=   /NLD *   /R0
      +   R13 *  R11 * NLD
      +  /R13 * /R11 * NLD
      +   FSYNC

/R13:=  /R14 *   /NLD
      +   R12 *  R10 * NLD
      +  /R12 * /R10 * NLD
      +   FSYNC

/R12:=  /R13 *   /NLD
      +   R11 * NLD *   R9
      +  /R11 * NLD *  /R9
      +   FSYNC

/R11:=  /R12 *   /NLD
      +   R10 * NLD *   R8
      +  /R10 * NLD *  /R8
      +   FSYNC

/R10:=  /R11 *   /NLD
```

```
/R3:= /R4  *     /NLD
    + /R14 *  R2  * NLD *  R0
    + /R14 * /R2  * NLD * /R0
    +  R14 *  R2  * NLD * /R0
    +  R14 * /R2  * NLD *  R0
    + FSYNC

/R2:= /R3  *     /NLD
    +  R14 * /R13 * NLD *  R1
    + /R14 * /R13 * NLD * /R1
    + /R14 *  R13 * NLD *  R1
    +  R14 *  R13 * NLD * /R1
    + FSYNC

/R1:= /R14 *  XOR * /FSYNC * NLD *  R0
    +  R14 * /XOR * /FSYNC * NLD *  R0
    + /R14 * /XOR * /FSYNC * NLD * /R0
    +  R14 *  XOR * /FSYNC * NLD * /R0
    + /FSYNC * /R2 *    /NLD

/R0:= /R14 * /R12 * /FSYNC * NLD
    +  R14 *  R12 * /FSYNC * NLD
    + /FSYNC *  /NLD * /R1 * /R0
    + /FSYNC *  /NLD *  R1 *  R0
    + INH
```

+ R7 * NLD * /R9
    + /R7 * NLD * /R9
    + FSYNC

/R9:= /R10 *     /NLD
    + R6 * NLD *  R8
    + /R6 * NLD * /R8
    + FSYNC

/R8:=       /NLD * /R9
    +  R7 *   R5 * NLD
    + /R7 *  /R5 * NLD
    + FSYNC

TABLE X

TITLE FILE RA_JM1.JED DIS-ASSEMBLED
DATE 10-26-88

CHIP DIS_ASM PAL16R8

CLK I2 I3 I4 I5 I6 I7 I8 I9 GND
OE R12 R13 R14 R15 R16 R17 R18 R19 VCC

EQUATIONS

```
/R19:=   I8 * /I9
    +  R18 *  R16 * /I8
    + /R18 * /R16 * /I8
    +  I7

/R18:= /R19 *  I8
    +  R17 *  R15 * /I8
    + /R17 * /R15 * /I8
    +  I7

/R17:= /R18 *  I8
    +  R16 *  R14 * /I8
    + /R16 * /R14 * /I8
    +  I7

/R16:= /R17 *  I8
    +  R15 * /I8 *  R13
    + /R15 * /I8 * /R13
    +  I7

/R15:= /R16 *  I8
    + /I3 *  R14 * /I8 *  R12
    + /I3 * /R14 * /I8 * /R12
```

```
/R18:=   I8 * /I9
    +  R17 *  R15 * /I8
    + /R17 * /R15 * /I8
    +  I7

/R17:= /R18 *  I8
    +  R16 *  R14 * /I8
    + /R16 * /R14 * /I8
    +  I7

/R16:= /R17 *  I8
    +  R15 * /I8 *  R13
    + /R15 * /I8 * /R13
    +  I7

/R15:= /R16 *  I8
    +  R14 * /I8 *  R12
    + /R14 * /I8 * /R12
    +  I7

/R14:= /R15 *  I8
    +  I3 * /I8 *  R13
    + /I3 * /I8 * /R13
```

```
    +    I3 *   R14 *  /I8 *  /R12
    +    I3 *  /R14 *  /I8 *   R12
    +    I7

/R14:= /R15 *    I8
    +    I3 *  /I5 *  /I8 *   R13
    +   /I3 *  /I5 *  /I8 *  /R13
    +   /I3 *   I5 *  /I8 *   R13
    +    I3 *   I5 *  /I8 *  /R13
    +    I7

/R13:= /I3 *    I4 *  /I7 *  /I8 *   R12
    +    I3 *  /I4 *  /I7 *  /I8 *   R12
    +   /I3 *  /I4 *  /I7 *  /I8 *  /R12
    +    I3 *   I4 *  /I7 *  /I8 *  /R12
    +   /I7 *  /R14 *   I8

/R12:= /I3 *  /I6 *  /I7 *  /I8
    +    I3 *   I6 *  /I7 *  /I8
    +   /I7 *   I8 *  /R13 *  /R12
    +   /I7 *   I8 *   R13 *   R12
    +    I2
```

```
    +    I7

/R13:= /R14 *   I8
    +    I4 *  /I8 *   R12
    +   /I4 *  /I8 *  /R12
    +    I7

/R12:=  I8 *  /R13
    +    I3 *   I5 *  /I8
    +   /I3 *  /I5 *  /I8
    +    I7
```

TABLE XI

Page 30

PAL 1

| PIN_NAME | SIGNAL NAME |
|---|---|
| CLK | CLK |
| I2 | INH |
| I3 | R14 |
| I4 | XOR |
| I5 | R13 |
| I6 | R12 |
| I7 | FSYNC |
| I8 | /NLD |
| I9 | R8 |
| R12 | R0 |
| R13 | R1 |
| R14 | R2 |
| R15 | R3 |
| R16 | R4 |
| R17 | R5 |
| R18 | R6 |
| R19 | R7 |

PAL 2

| PIN_NAME | SIGNAL NAME |
|---|---|
| CLK | CLK |
| I2 | INH |
| I3 | R7 |

| | |
|---|---|
| I4 | R6 |
| I5 | R5 |
| I6 | NO CONNECTION |
| I7 | FSYNC |
| I8 | /NLD |
| I9 | R0 |
| R12 | R8 |
| R13 | R9 |
| R14 | R10 |
| R15 | R11 |
| R16 | R12 |
| R17 | R13 |
| R18 | R14 |
| R19 | NO CONNECTION |

TABLE XII

1. A data randomizing/de-randomizing circuit for randomizing data or de-randomizing previously randomized data according to a randomization scheme utilizing an irreducible generator polynomial which operates on a serial bit stream of words of data which is supplied to said circuit in a format, either LSB or MSB first, different from the format according to which the data was previously randomized or will be subsequently de-randomized, said circuit comprising:
   (a) shift register means arranged to generate said irreducible generator polynomial;
   (b) means for shifting the contents of said shift register means in response to a clock signal in a given direction;
   (c) means for exclusively ORing the contents of a bit in said shift register means with a bit in said bit stream; and
   (d) means for periodically setting the state of said shift register means a predetermined number of states in a direction effectively the opposite to which said shift register means propagates in response to said shifting means, said setting means being effective once every N states, where N equals the number of bits in a word in said serial bit stream and wherein said predetermined number of states equals 2N−1.

2. The circuit according to claim 1, wherein N equals 16 and further including means for initializing the contents of said shift register means to $3_{16}$.

3. The circuit according to claim 2, wherein said shift register means includes fifteen flip flops arranged to generate the irreducible generator polynomial $g(x)=x^{15}+x+1$.

4. The circuit according to claim 3, wherein said setting means includes gate logic means for each flip flop in said shift register means, the gate logic means for each flip flop being responsive to at least the contents of two other flip flops in said shift register means.

5. The circuit according to claim 4, wherein said gate logic means for stage zero of said shift register means is responsive to the contents stages twelve and fourteen, wherein said gate logic means for stage one of said shift register means is responsive to the contents stages nine, twelve, thirteen and fourteen, wherein said gate logic means for stage two of said shift register means is responsive to the contents stages one, thirteen and fourteen and wherein said gate logic means for stage three of said shift register means is responsive to the contents stages two, nine and fourteen.

6. The circuit according to claim 5, wherein said gate logic means for each of the remaining stages of said shift register means is responsive to the contents of an adjacent less significant stage and to the contents of a stage which is three bits less significant.

7. The circuit according to claim 6, wherein said shifting means and said setting means include an arrangement of gates for interconnecting said flip flops, said arrangement of gates being responsive to a shift generate signal and to a jump signal, said arrangement of gates causing said shift register means to propagate data therein when enabled by said shift generate signal and causing said shift register means to be initialized with data from said gate logic means when enabled by said jump signal.

8. The circuit according to claim 1, wherein said shift register means includes a plurality flip flops and at least one XOR gate arranged to generate said irreducible generator polynomial, said shifting means and said setting means including an arrangement of gates for interconnecting said flip flops, said arrangement of gates being responsive to a shift generate signal and to a jump signal, said arrangement of gates causing said shift register means to propagate data therein when enabled by said shift generate signal and causing said shift register means to be initialized with data from said setting means when enabled by said jump signal.

9. The circuit according to claim 1, wherein N equals 8 and further including means for initializing the contents of said shift register means to $40_{16}$.

10. The circuit according to claim 9, wherein said shift register means includes thirteen flip flops arranged to generate the irreducible generator polynomial $g(x)=x^{13}+x^4+x^3+x+1$.

11. The circuit of claim 1 wherein said shift register means and said means for periodically setting the state of said shift register means is provided by a programmed logic array.

12. A data randomizing/de-randomizing circuit for randomizing data or de-randomizing previously randomized data according to a randomization scheme utilizing an irreducible generator polynomial which operates on a serial bit stream of words of data which is supplied to said circuit in a format, either LSB or MSB first, different from the format according to which the data was previously randomized or will be subsequently de-randomized, said circuit comprising:

(a) a programmed logic array arranged to generate terms of said irreducible generator polynomial, said programmed logic array including means to pseudo-randomly shift those terms in response to a clock signal and means for periodically setting the state of those terms a predetermined number of states in a direction effectively the opposite to which said programmed logic array propagates in response to said clock signal, said setting means being effective once every N states, where N equals the number of bits in a word in said serial bit stream and wherein said predetermined number of states equals $2N-1$; and (b) means for exclusively ORing the contents of a bit in said programmed logic array with a bit in said bit stream.

13. The circuit of claim 12, wherein said setting means includes means for exclusively ORing the non-paired coefficients of the solutions to the equation $S(x) = x^{2N-1} R(x) \text{ MOD } g(x)$, where $R(x)$ is the desired terms of the programmed logic array and $g(x)$ is the irreducible generator polynomial.

14. A method of electronically randomizing data or de-randomizing previously randomized data according to a randomization scheme utilizing an irreducible generator polynomial which operates on a serial bit stream of words of data which is supplied to said circuit in a format, either LSB or MSB first, different from the format according to which the data was previously randomized or will be subsequently de-randomized, said method comprising the steps of:

(a) shifting the contents of a memory means in response to a clock signal in a given direction, the memory means being arranged to generate said irreducible generator polynomial;

(b) exclusively ORing the contents of a bit in said memory means with a bit in said bit stream; and (c) periodically interrupting the shifting of said shifting step and instead setting the state of said memory means a predetermined number of states in a direction effectively the opposite to which said memory means normally propagates in response to said shifting step, said interrupting and setting step occurring once every N states, where N equals the number of bits in a word in said serial bit stream and wherein said predetermined number of states equals $2N-1$.

15. The method according to claim 14, wherein said memory means is provided by a programmed logic array.

16. The method according to claim 14, wherein N equals 8 and further including the step of initializing the contents of said memory means to $80_{16}$.

17. The method according to claim 16, wherein said memory means generates the irreducible generator polynomial $g(x) = x^{13} + x^4 + x^3 + x + 1$.

18. The method according to claim 14, wherein N equals 16 and further including the step of initializing the contents of said memory means to $3_{16}$.

19. The method according to claim 18, wherein said memory means generates the irreducible generator polynomial $g(x) = x^{15} + x + 1$.

20. The method according to claim 18, wherein said memory means is provided by a programmed logic array.

21. A circuit for randomizing data or de-randomizing previously randomized data according to a randomization scheme utilizing an irreducible generator polynomial which operates on a serial bit stream of words of data which is supplied to said circuit in a format, either LSB or MSB first, different from the format according to which the data was previously randomized or will be subsequently de-randomized, said circuit comprising:

(a) means for generating said irreducible generator polynomial;

(b) means for triggering said generator means in a given direction in response to a clock signal;

(c) means for exclusively ORing the contents of a bit in said generating means with a bit in said bit stream; and (d) means for periodically interrupting said triggering means and instead setting the state of said generating means a predetermined number of states in a direction effectively the opposite to which said generating means normally generates data.

22. The circuit of claim 21 wherein the periodic setting occurs once every N states, wherein N equals the number of bits in a word in said serial bit stream and wherein said predetermined number of states equals $2N-1$.

* * * * *